(12) United States Patent
Han et al.

(10) Patent No.: US 8,953,356 B2
(45) Date of Patent: Feb. 10, 2015

(54) SEMICONDUCTOR DEVICES

(75) Inventors: Seunguk Han, Suwon-si (KR); Jay-Bok Choi, Hwaseong-si (KR); Dong-Hyun Lee, Hwaseong-si (KR); Namho Jeon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 291 days.

(21) Appl. No.: 13/525,675

(22) Filed: Jun. 18, 2012

(65) Prior Publication Data
US 2012/0320655 A1 Dec. 20, 2012

(30) Foreign Application Priority Data

Jun. 17, 2011 (KR) ........................ 10-2011-0059022

(51) Int. Cl.
| G11C 5/02 | (2006.01) |
| G11C 5/06 | (2006.01) |
| H01L 27/02 | (2006.01) |
| H01L 27/105 | (2006.01) |
| H01L 29/40 | (2006.01) |
| H01L 29/10 | (2006.01) |
| H01L 29/423 | (2006.01) |
| H01L 27/088 | (2006.01) |
| H01L 27/108 | (2006.01) |
| H01L 27/115 | (2006.01) |
| H01L 27/11 | (2006.01) |

(52) U.S. Cl.
CPC ............ *G11C 5/025* (2013.01); *H01L 27/0207* (2013.01); *H01L 27/1052* (2013.01); *H01L 29/4238* (2013.01); *H01L 29/1033* (2013.01); *H01L 27/088* (2013.01); *H01L 27/10873* (2013.01); *H01L 27/10882* (2013.01); *H01L 27/10885* (2013.01); *H01L 27/10888* (2013.01); *H01L 27/10894* (2013.01); *H01L 27/10897* (2013.01); *H01L 27/11526* (2013.01); *H01L 27/11573* (2013.01); *H01L 27/1116* (2013.01)
USPC .......... 365/63; 365/72; 365/230.06; 257/401; 257/E29.12

(58) Field of Classification Search
USPC ............ 365/63, 72, 230.06; 257/401, E29.12
See application file for complete search history.

(56) References Cited

U.S. PATENT DOCUMENTS

| 6,236,258 B1 * | 5/2001 | Hoenigschmid et al. ..... 327/534 |
| 6,747,320 B2 * | 6/2004 | Nakabayashi ................ 257/369 |

(Continued)

FOREIGN PATENT DOCUMENTS

| JP | 2000-187978 | 7/2000 |
| KR | 1020020018313 | 3/2002 |
| KR | 1020090076139 | 7/2009 |

*Primary Examiner* — J.H. Hur
(74) *Attorney, Agent, or Firm* — F. Chau & Associates, LLC

(57) ABSTRACT

A semiconductor device includes a cell region including memory cells that have a selection element and a data storage element, and a driving circuit region including a driving transistor configured to operate the selection element. The driving transistor includes active portions defined by a device isolation pattern in a substrate and a gate electrode running across the active portion along a first direction, the gate electrode including channel portions of a ring-shaped structure. The driving transistor further includes first impurity doped regions disposed in the active portions that are surrounded by channel portions, and second impurity doped regions disposed in the active portion that are separated from the first impurity doped regions by the channel portions.

17 Claims, 44 Drawing Sheets

(56) References Cited

U.S. PATENT DOCUMENTS

| | | | |
|---|---|---|---|
| 6,768,143 B1 * | 7/2004 | Fredeman et al. | 257/206 |
| 7,016,214 B2 * | 3/2006 | Kawamata et al. | 365/63 |
| 7,215,562 B2 * | 5/2007 | Sekine | 365/72 |
| 8,022,484 B2 | 9/2011 | Nobutoki et al. | |
| 2005/0232044 A1 * | 10/2005 | Akiyama et al. | 365/207 |
| 2007/0253267 A1 * | 11/2007 | Nobutoki et al. | 365/207 |
| 2008/0054262 A1 * | 3/2008 | Nakaya et al. | 257/48 |
| 2010/0197097 A1 * | 8/2010 | Hasunuma et al. | 438/284 |

* cited by examiner

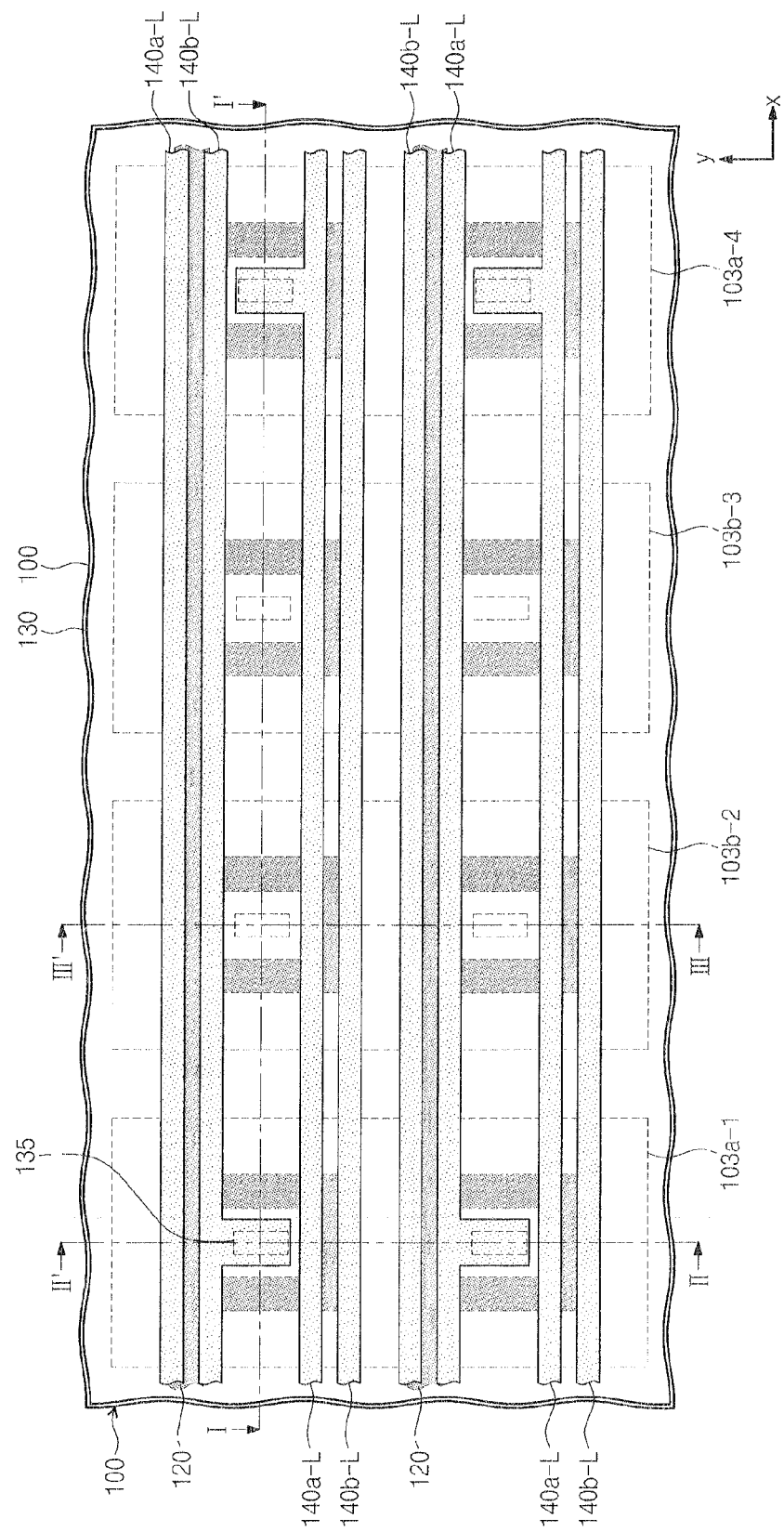

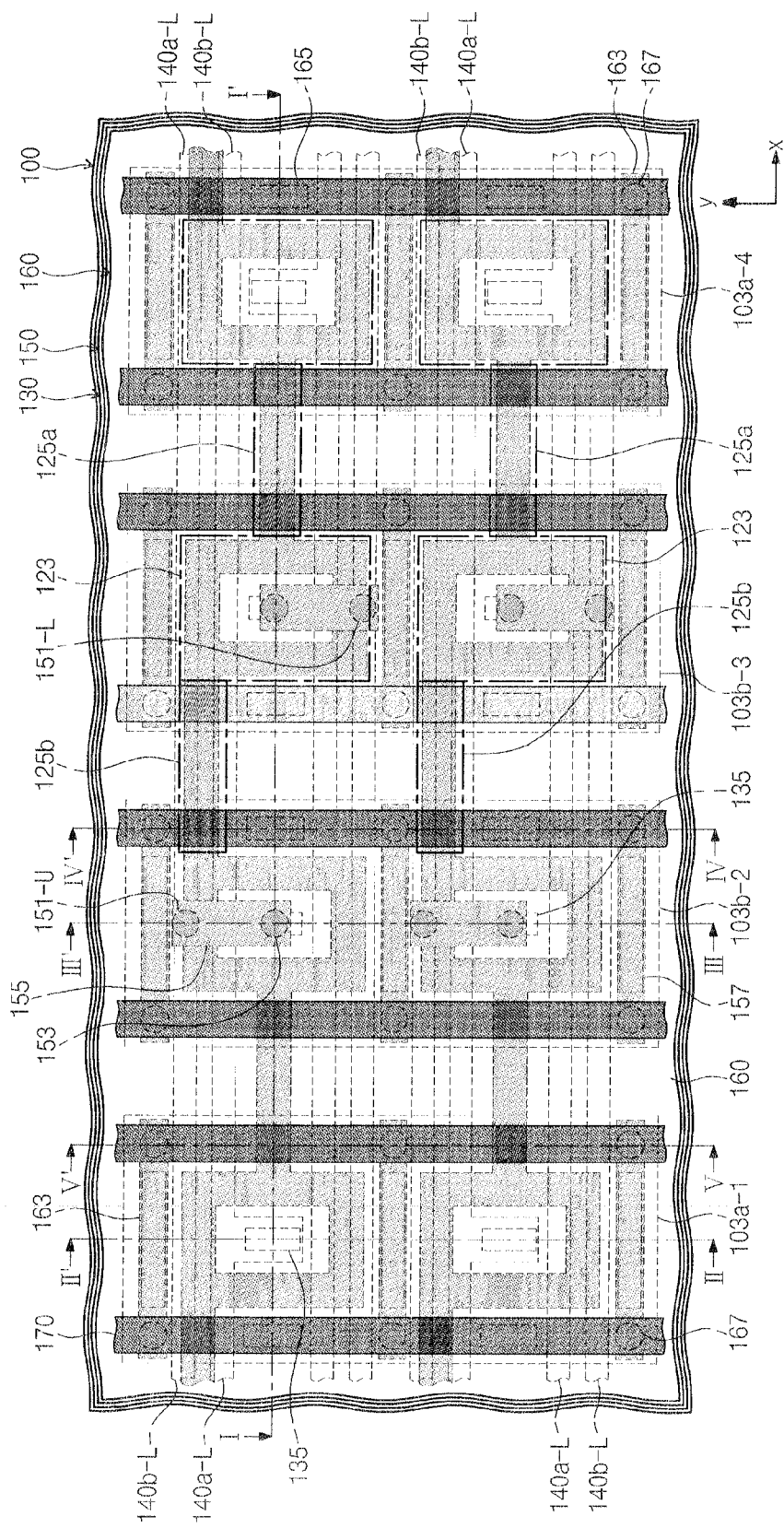

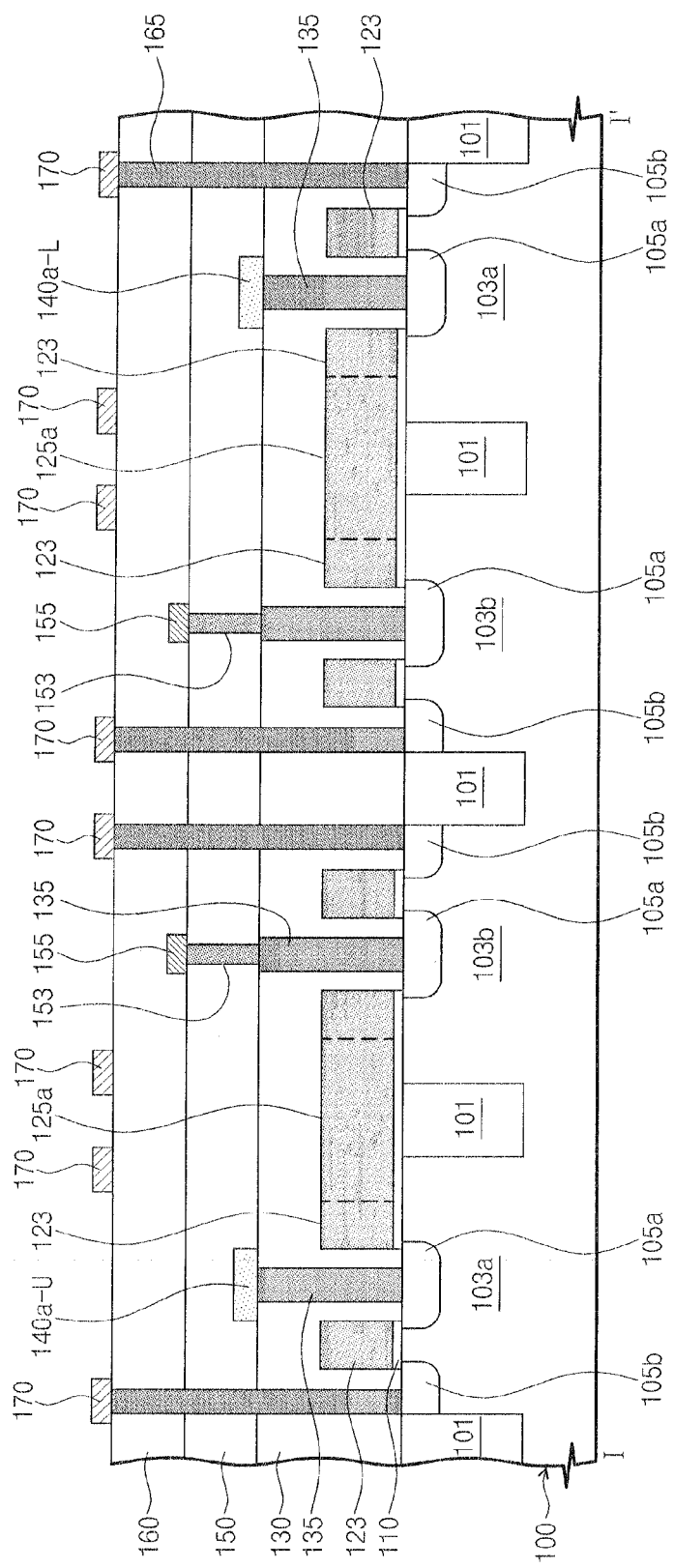

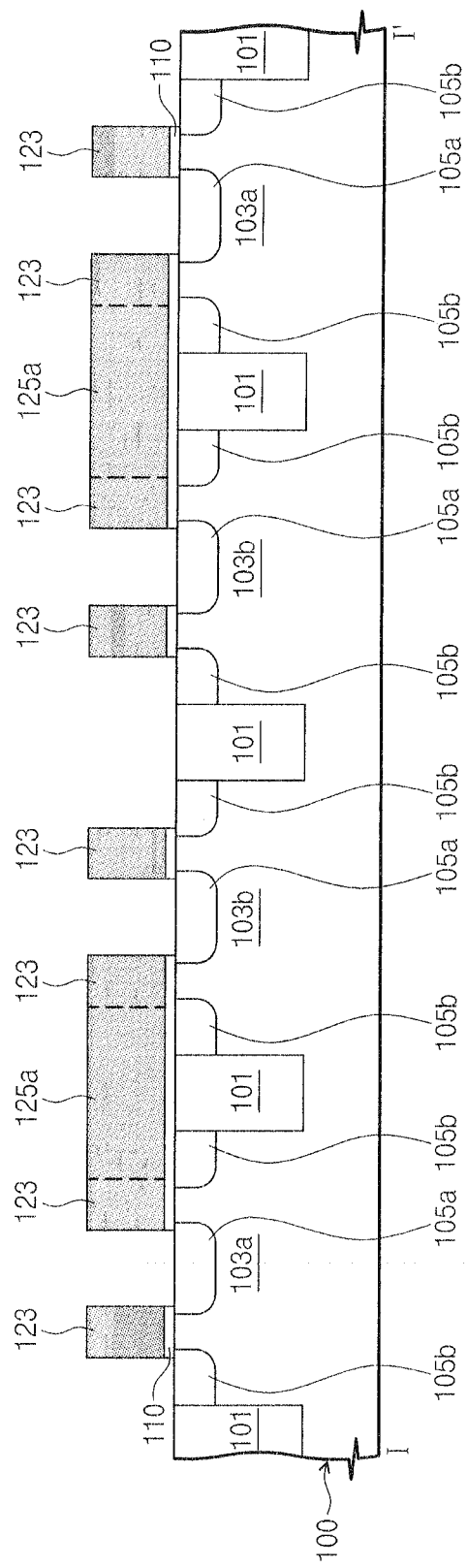

SEMICONDUCTOR DEVICES

CROSS-REFERENCE TO RELATED APPLICATIONS

This U.S. non-provisional patent application claims priority under 35 U.S.C. §119 to Korean Patent Application No. 10-2011-0059022, filed on Jun. 17, 2011, the entirety of which is incorporated by reference herein.

BACKGROUND

The present inventive concept herein relates to semiconductor devices and, more particularly, to a semiconductor device including a gate electrode with a channel portion.

For mobile consumer products such as notebook computers and smart phones, semiconductor devices need to meet incompatible demands of high performances and scaling down of device size. To satisfy such incompatible demands, it is particularly required that semiconductor devices be scaled down using a device structure immune to reliability issues.

SUMMARY

In an embodiment of the inventive concept, a semiconductor device comprises a cell region including memory cells that have a selection element and a data storage element, and a driving circuit region including a driving transistor configured to operate the selection element. The driving transistor comprises active portions defined by a device isolation pattern in a substrate and a gate electrode running across the active portion along a first direction, the gate electrode including channel portions of a ring-shaped structure. The driving transistor further comprises first impurity doped regions disposed in the active portions that are surrounded by channel portions, and second impurity doped regions disposed in the active portion that are separated from the first impurity doped regions by the channel portions.

The gate electrode further includes connecting portions being arranged in a row along the first direction and the connecting portions connect two neighboring channel portions. Bit line contact plugs are disposed the first impurity doped regions. A first bit line runs along the first direction, having a pad protruding to a second direction. The pad is connected to one of the bit line contact plugs and the second direction is perpendicular to the first direction. A second bit line runs along the first direction and is connected to another of the bit line contact plugs through an assistant pad. The assistant pad is formed over the first bit line and runs along the second direction. A first assistant contact plug connects the second bit line and the assistant pad, and the second assistant contact plug connects the another of the hit line contact plugs and the assistant pad.

First source contact plugs and second source contact plugs are formed on the second impurity doped regions and are disposed between the device isolation pattern and the channel portions. The first source contact plugs are disposed either side of the channel portions along the second direction, and the second source contact plugs are disposed either side of the channel portions along the first direction. Metal wires run in parallel along the second direction. The metal wires directly contact the second source contact plugs, and the metal wires directly contact the first source contact plugs formed on the conductive pads. A pair of the metal wires is disposed over each of the active portions. Each of the connecting portions runs along an imaginary line running through centers of the two neighboring channel portions.

Alternatively, first source contact plugs and second source contact plugs are formed on the second impurity doped regions and are disposed between the device isolation pattern and the channel portions. The first source contact plugs are disposed either side of the channel portions along the second direction and the second source contact plugs are disposed one side of the channel portions along the first direction.

In another embodiment of the inventive concept, a semiconductor device comprises a device isolation pattern, a first active portion surrounded by the device isolation pattern, and a second active portion surrounded by the device isolation pattern and disposed next to the first active portion along a first direction. The semiconductor device further comprises a gate electrode running across the first and second active portions along the first direction. The gate electrode comprises a first channel portion and a second channel portion. The first channel portion is disposed on the first active portion and has a first ring-shaped structure. The second channel portion is disposed on the second active portion and has a second ring-shaped structure. The semiconductor device further comprises a first bit line running across the first and second active portions along the first direction and having a pad protruding to the second direction. The pad is electrically connected to a first impurity doped region surrounded by the first ring-shaped structure. A second bit line also runs across the first and second active portions along the first direction and electrically connected to a first impurity doped region surrounded by the second ring-shaped structure.

A connecting portion runs along the first direction, connecting the first ring-shaped structure and the second ring-shaped structure. The connecting portion runs along an imaginary line running through a center of the first ring-shaped structure and a center of the second ring-shaped structure.

The first active portion includes a second impurity region separated by the first ring-shaped structure from the first impurity region surrounded by the first ring-shaped structure. The second active portion includes a second impurity region separated by the second ring-shaped structure from the first impurity region surrounded by the second ring-shaped structure.

The pad of the first bit line is connected to a bit line contact formed on the first impurity doped region surrounded by the first ring-shaped structure. The second bit line is connected to the first impurity doped region surrounded by the second ring-shaped structure through a two-level interconnection. The two-level interconnection includes a conductive pad and a second interlayer dielectric layer, wherein the conductive pad is disposed on the second interlayer dielectric layer and the second bit line is disposed in the dielectric layer below the conductive pad. The two-level interconnection further includes a first assistant contact plug and a second assistant contact plug. The first assistant contact plug connects the second bit line and the conductive pad, and the second assistant contact plug connects the conductive pad and the first impurity doped region surrounded by the second ring-shaped structure by a second assistant contact plug.

The first active portion further comprise first source contact plugs and second source contact plugs disposed between the device isolation pattern and the first ring-shaped structure. The first source contact plugs are disposed either side of the channel portion along the second direction and the second source contact plugs are disposed either side of the channel portion along the first direction.

BRIEF DESCRIPTION OF TILE DRAWINGS

The inventive concept will become more apparent in view of the attached drawings and accompanying detailed description.

FIGS. 2A to 7A are plan views illustrating a method of forming a semiconductor device according to embodiments of the inventive concept;

FIGS. 2B to 7B are cross sectional views taken along lines I-I' of FIGS. 2A to 7A, respectively;

FIGS. 2C to 7C are cross sectional views taken along lines II-II' of FIGS. 2A to 7A, respectively;

FIGS. 4D to 7D are cross sectional views taken along lines III-III' of FIGS. 4A to 7A, respectively;

Figure 8C:
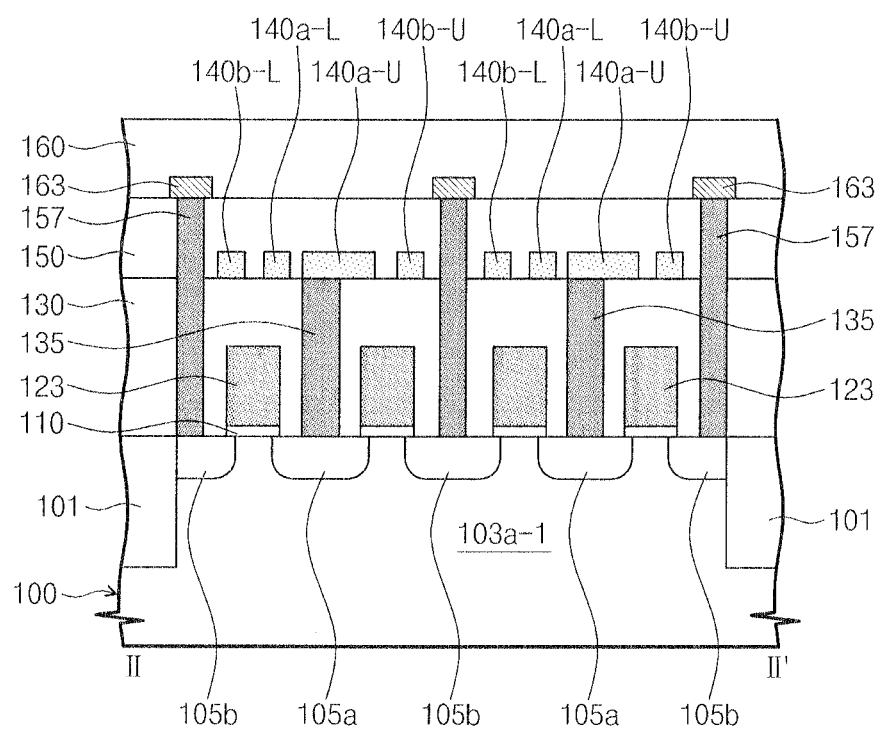
Figure 8D:
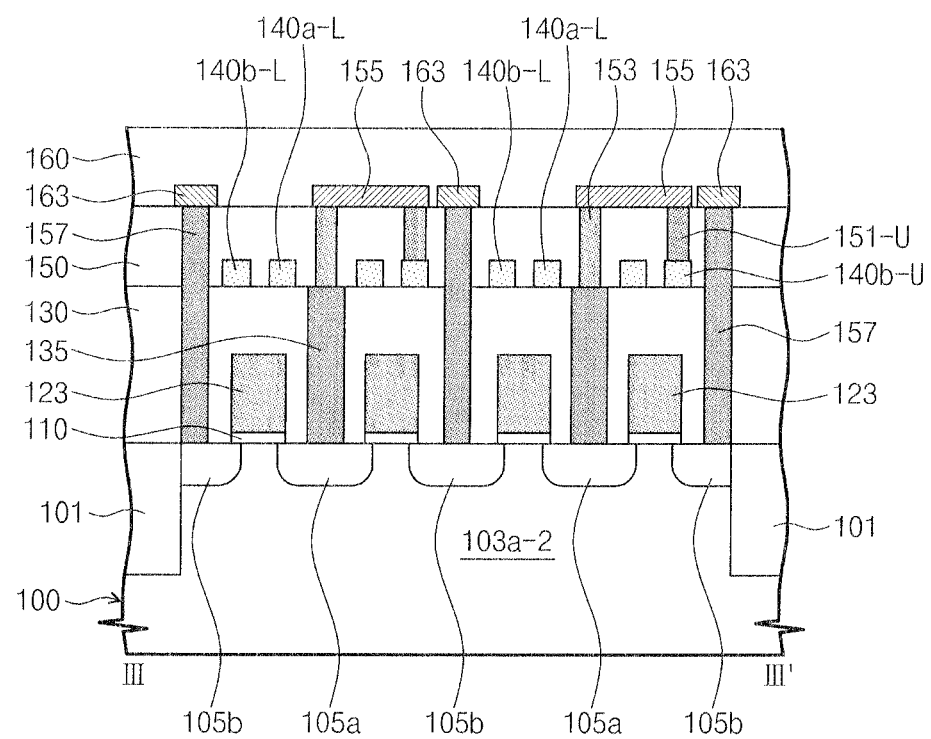
Figure 8E:
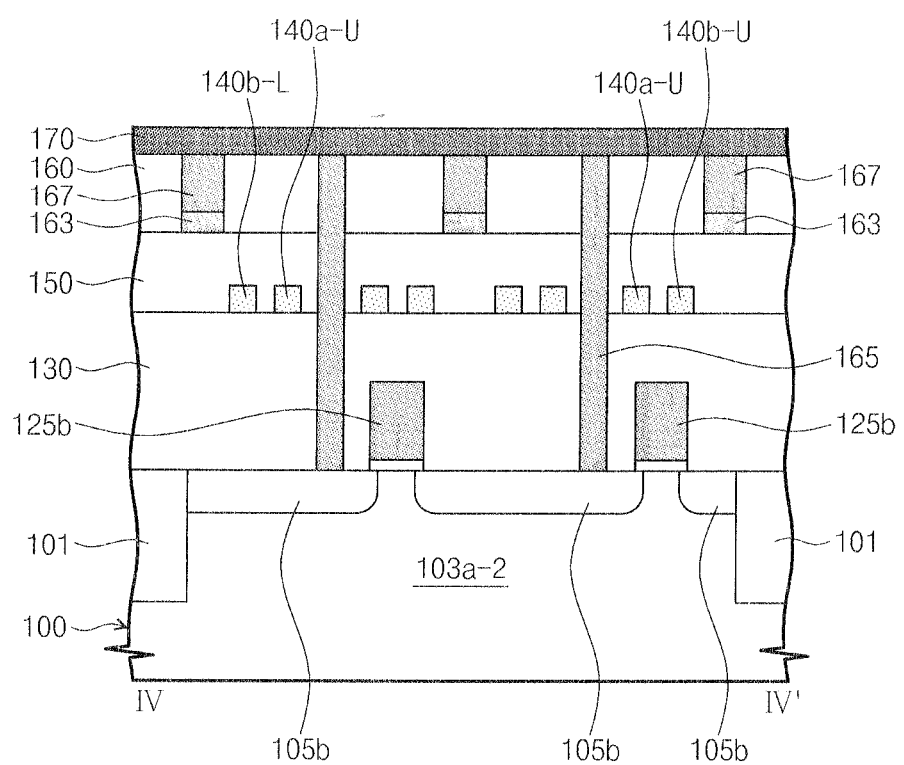
Figure 8F:
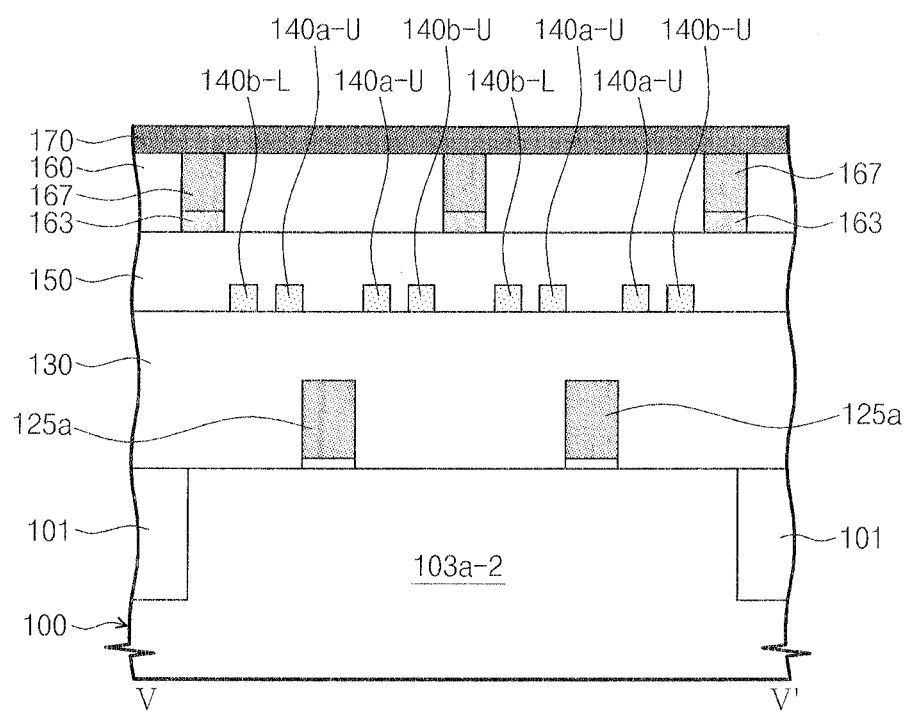
Figure 9A:
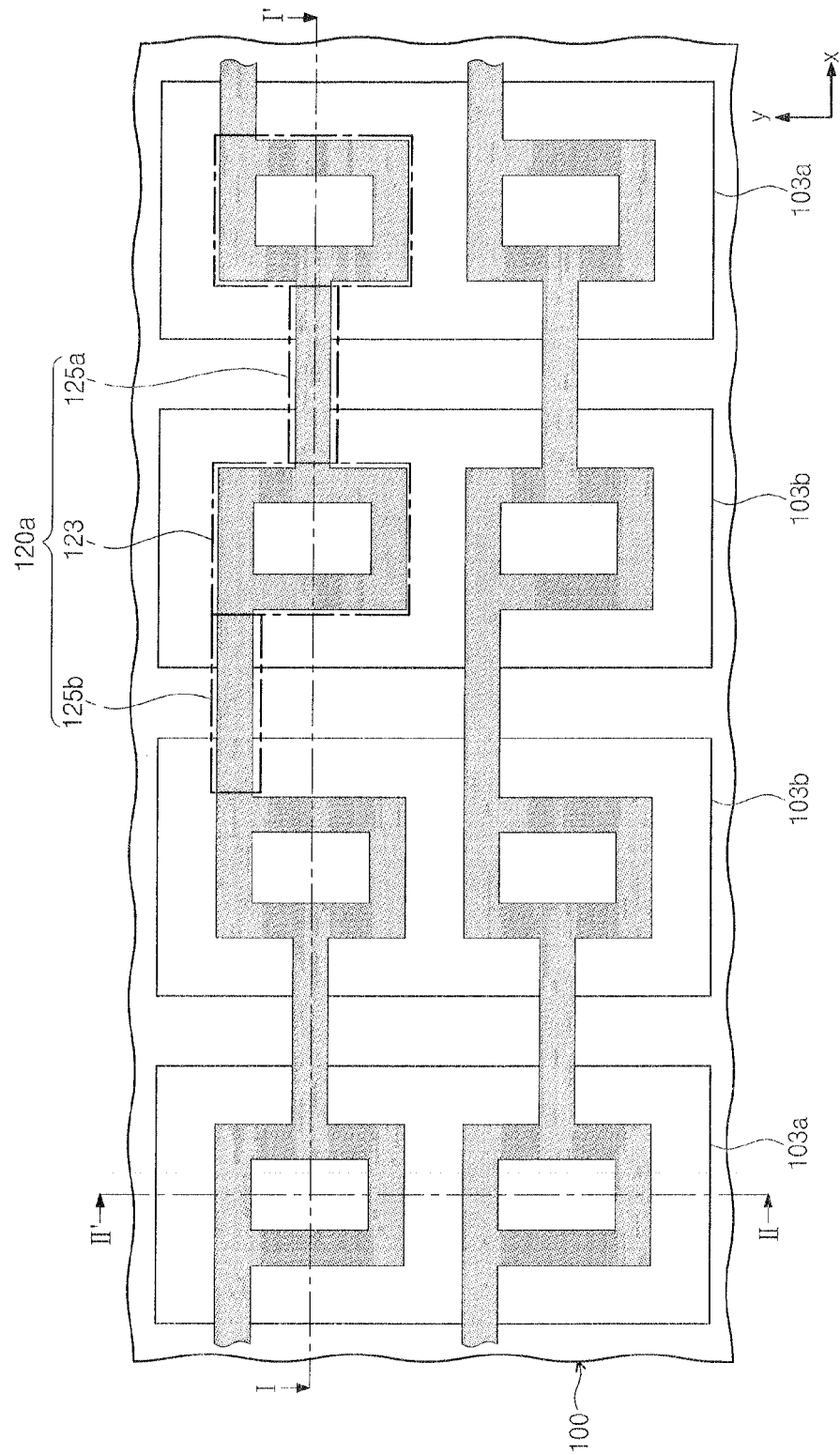
Figure 9C:
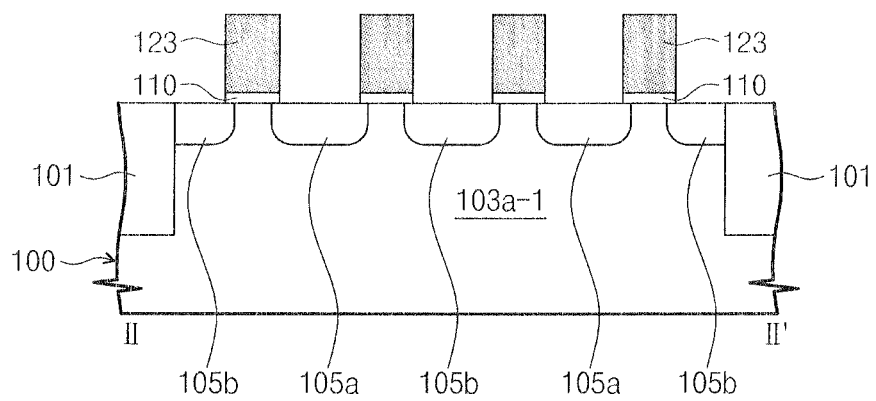
Figure 10A:
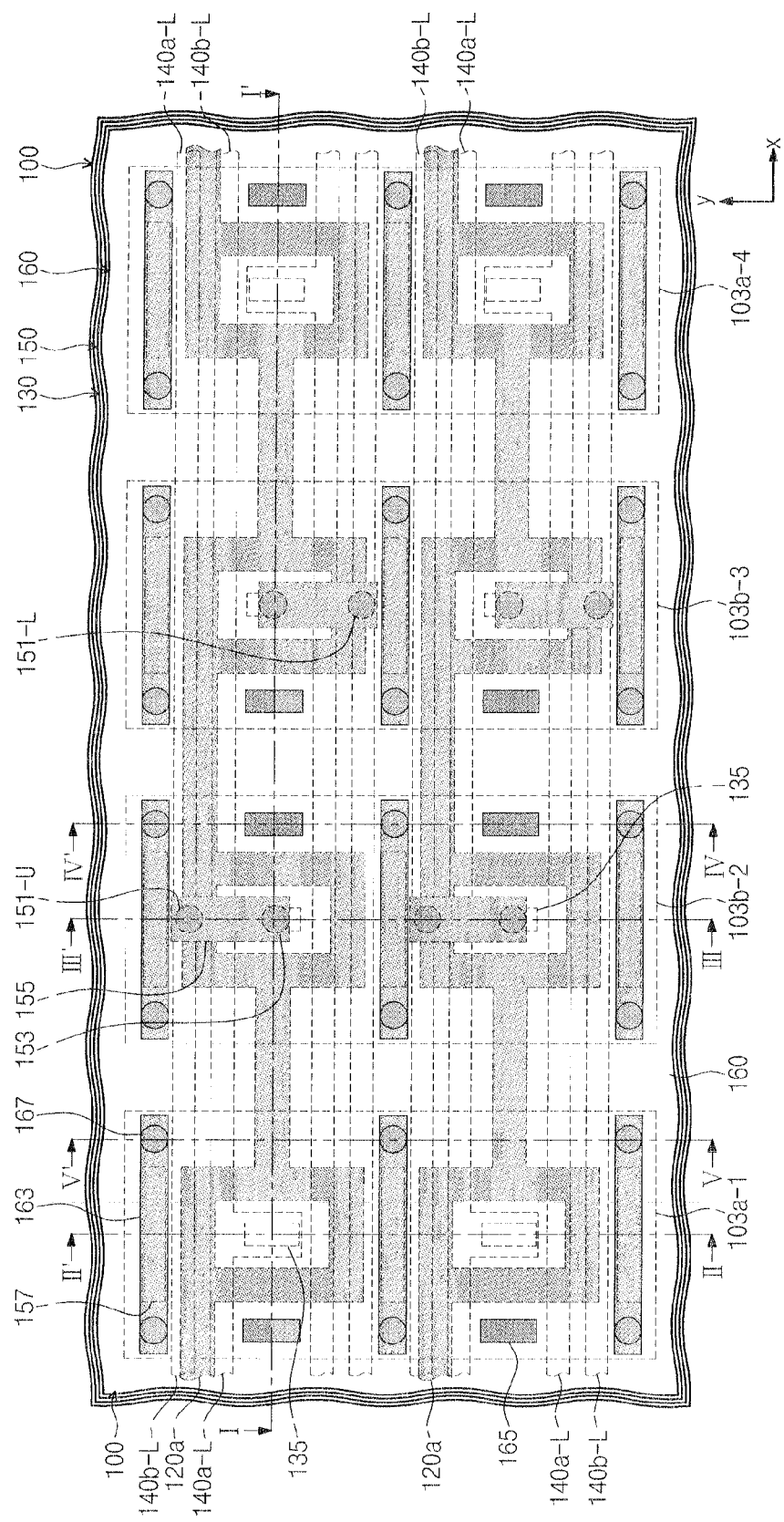
Figure 10B:
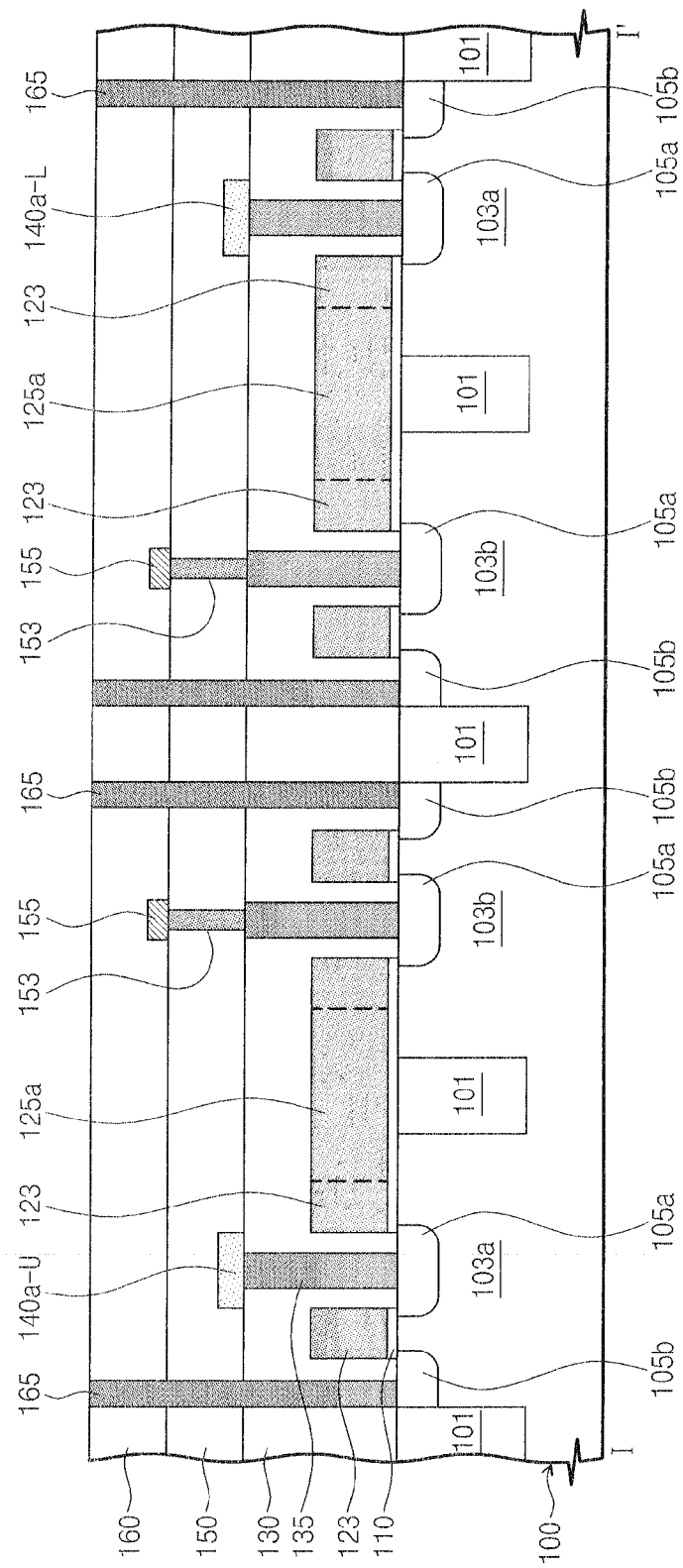
Figure 10C:
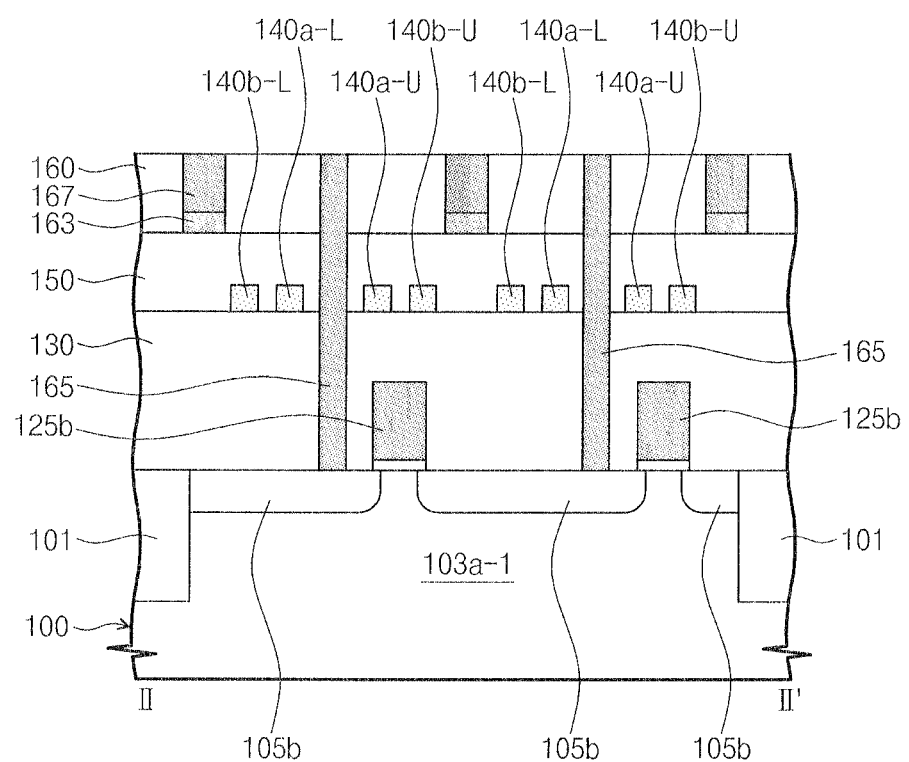
Figure 10D:
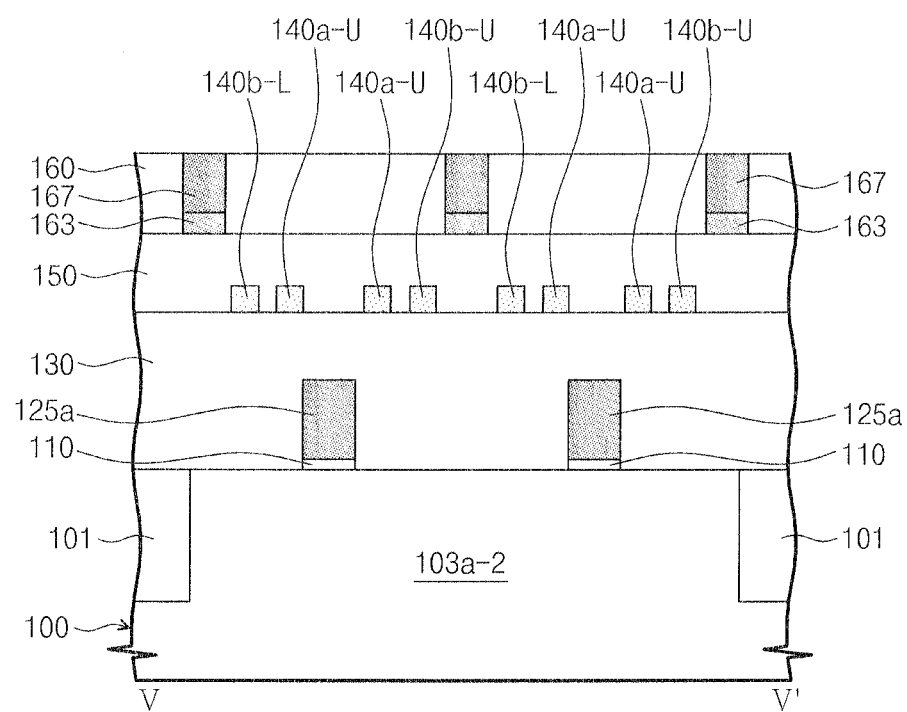
Figure 11:
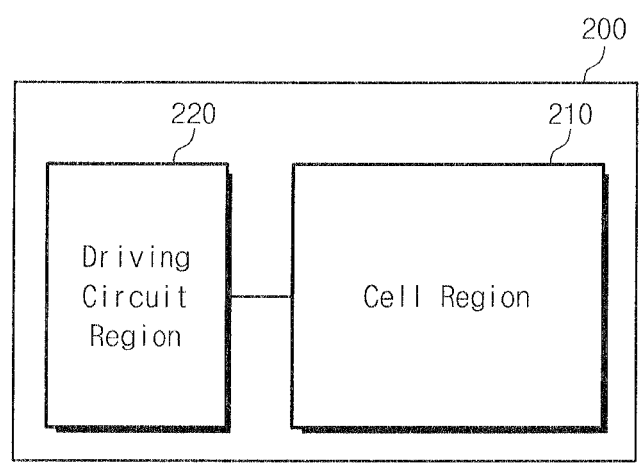
Figure 12:
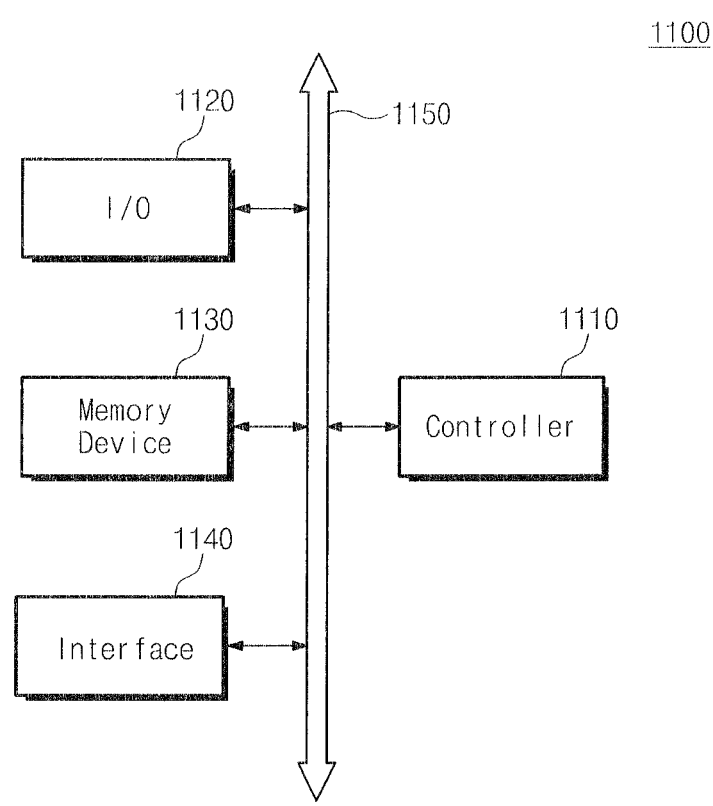
Figure 13:
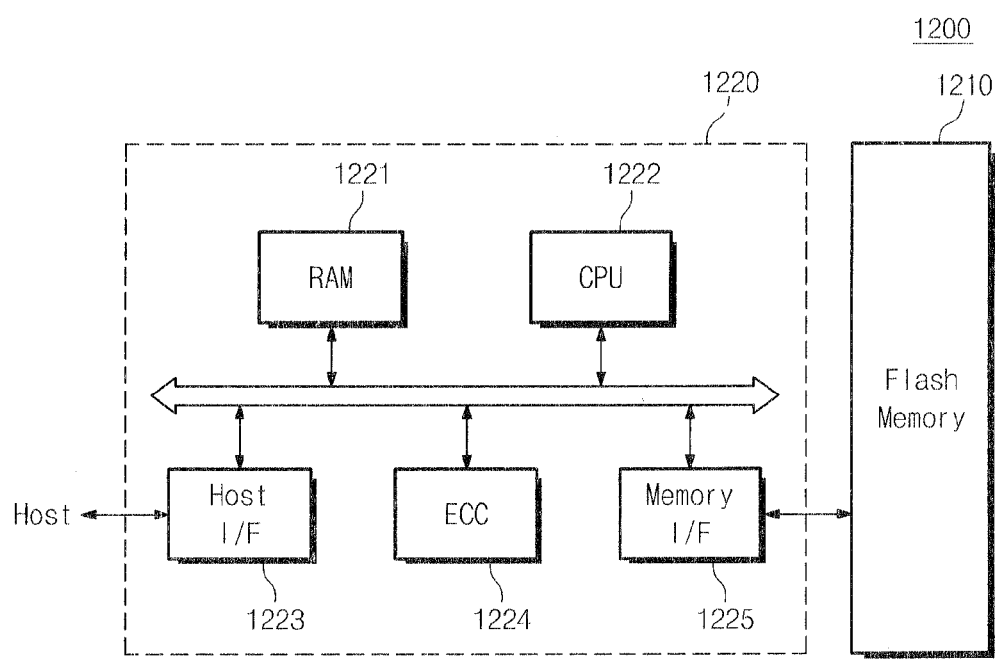

FIG. 8A a plan view illustrating a semiconductor device according to other embodiments of the inventive concept;

FIG. 8B is a cross section view taken along a line I-I' of FIG. 8A;

FIG. 8C is a cross section view taken along a line II-II' of FIG. 8A;

FIG. 8D is a cross section view taken along a line III-III' of FIG. 8A;

FIG. 8E is a cross section view taken along a line IV-IV' of FIG. 8A;

FIG. 8F is a cross section view taken along a line V-V' of FIG. 8A;

FIGS. 9A and 10A are plan views illustrating a method of forming a semiconductor device according to other embodiments of the inventive concept;

FIG. 9B is a cross sectional view taken along a line I-I' of FIG. 9A;

FIG. 9C is a cross sectional view taken along a line II-II' of FIG. 9A;

FIG. 10B is a cross sectional view taken along a line I-I' of FIG. 10A;

FIG. 10C is a cross sectional view taken along a line IV-IV' of FIG. 10A;

FIG. 10D is a cross sectional view taken along a line V-V' of FIG. 10A;

FIG. 11 is a schematic block diagram illustrating a semiconductor device according to embodiments of the inventive concept;

FIG. 12 is a schematic block diagram illustrating an example of an electronic system including semiconductor devices according to embodiments of the inventive concept; and FIG. 13 is a schematic block diagram illustrating an example of a memory card including semiconductor devices according to embodiments of the inventive concept.

DETAILED DESCRIPTION OF THE EMBODIMENTS

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the drawings are schematic in nature and their shapes are not intended to illustrate the actual shape of a region of a device and are not intended to limit the scope of example embodiments.

Figure 1A:
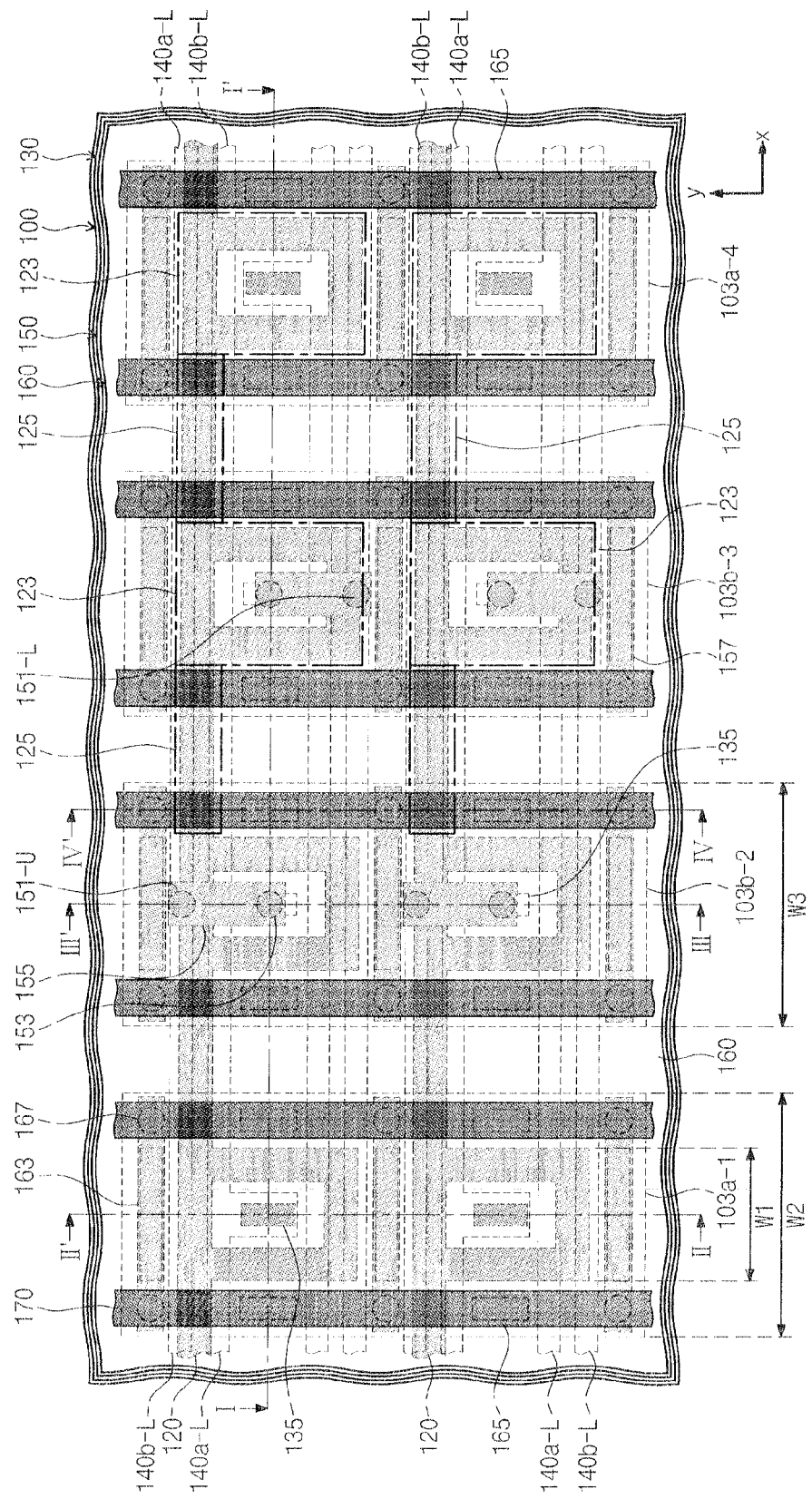
FIG. 1A is a plan view illustrating a semiconductor device according to embodiments of the inventive concept.
Figure 1B:
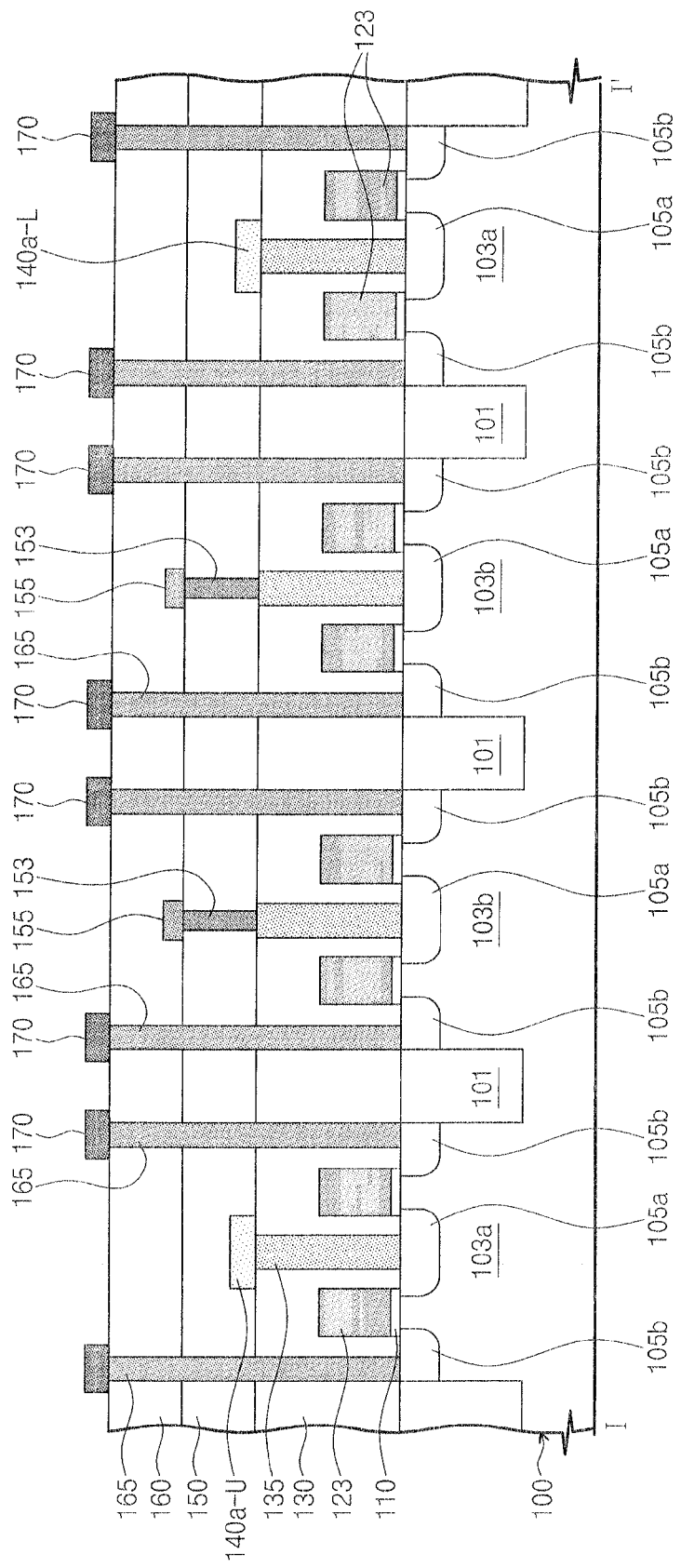
FIG. 1B is a cross sectional view taken along a line I-I' of FIG. 1A.
Figure 1C:
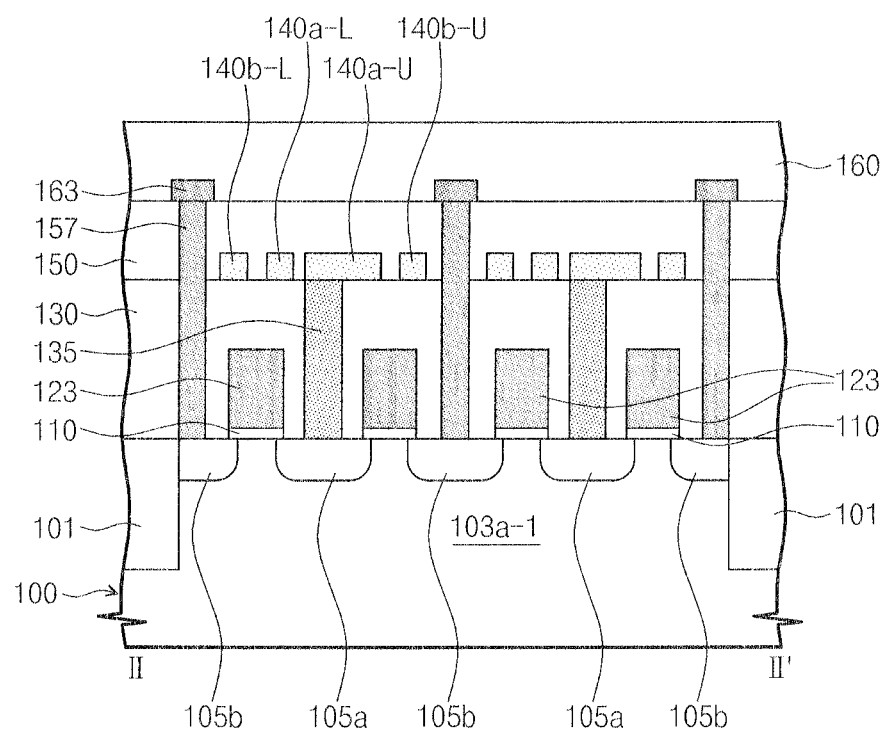
FIG. 1C is a cross sectional view taken along a line II-II' of FIG. 1A.
Figure 1D:
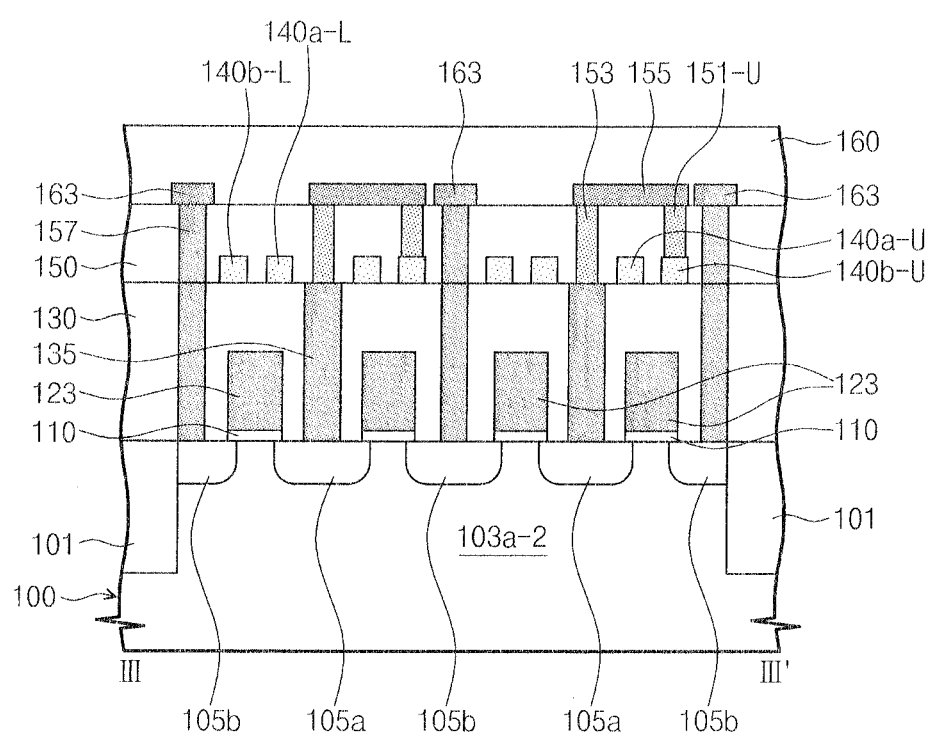
FIG. 1D is a cross sectional view taken along a line III-III' of FIG. 1A.
Figure 1E:
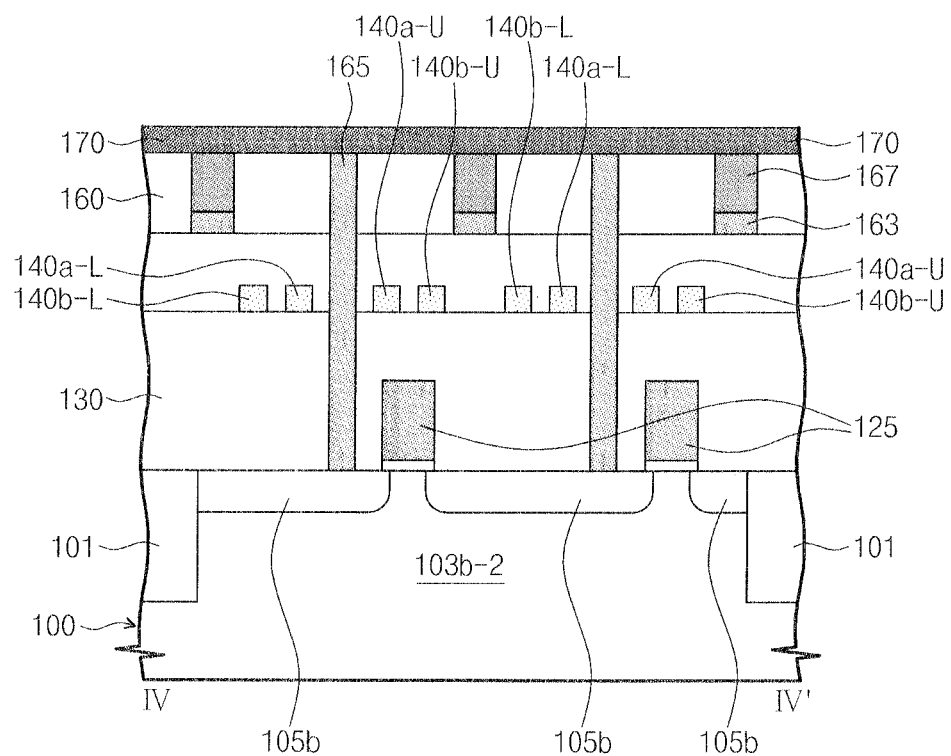
FIG. 1E is a cross sectional view taken along a line IV-IV' of FIG. 1A.

A semiconductor device according to embodiments of the inventive concept will be described, hereinafter. FIG. 1A is a plan view illustrating a semiconductor device according to embodiments of the inventive concept. FIG. 1B is a cross sectional view taken along a line I-I' of FIG. 1A, and FIG. 1C is a cross sectional view taken along a line II-II' of FIG. 1A. FIG. 1D is a cross sectional view taken along a line III-III' of FIG. 1A, and FIG. 1E is a cross sectional view taken along a line IV-IV' of FIG. 1A.

Referring to FIGS. 1A to 1E, a device isolation pattern 101 may be disposed in a substrate 100 to define a pair of first active portions 103a-1 and 103a-4 and a pair of second active portions 103b-2 and 103b-3. The device isolation pattern 101 may be a shallow trench isolation (STI), however, the inventive concept is not limited thereto. The device isolation pattern 101 may include an insulating material. For example, the device isolation pattern 101 may include at least one of oxide, nitride and oxynitride. The substrate 100 may include a semiconductor material. For example, the substrate 100 may include at least one of silicon or germanium.

The active portions 103a-1, 103a-4, 103b-2 and 103b-4 may be portions of the substrate 100 surrounded by the device isolation pattern 101, respectively. In an embodiment, each of the active portions 103a-1, 103a-4, 103b-2 and 103b-4 may be arranged in a row along a first direction. The first direction may be parallel to an x-axis of FIG. 1. The pair of second active portions 103b-2 and 103b-3 may be disposed between the pair of first active portions 103a-1 and 103a-4. That is, the pair of second active portions 103b-2 and 103b-3 may be adjacent each other, and the pair of first active portions 103a-1 and 103a-4 may be separated one another by the pair of second active portions 103b-2 and 103b-3. The first direction may be parallel to an x-axis of FIG. 2A.

The substrate 100 may include a semiconductor material. For example, the substrate 100 may include at least one of silicon or germanium.

In an embodiment, the first active portions 103a and the second active portions 103b may be arranged in a first direction to constitute a row when viewed from a plan view. The pair of second active portions 103b may be disposed between the pair of the first active portions 103a. That is, one second active portion 103b may be disposed between one first active portion 103a and another second active portion 103b which are adjacent to the one second active portion 103b in the row. The first direction may be parallel to an x-axis of FIG. 1.

A pair of gate electrodes 120 may run across the active portions 103a-1, 103b-2, 103b-3 and 103a-4 and the device isolation 101 along the first direction. The gate electrodes 120 may include at least one of a semiconductor material doped with, dopant (e.g. doped silicon), a conductive metal nitride (e.g. titanium nitride, tantalum nitride, or tungsten nitride), and metal (e.g. ruthenium, iridium, titanium, tungsten or tantalum).

Each of the gate electrodes 120 may include a plurality of channel portions 123 and a plurality of connecting portions 125. The channel portions 123 may be disposed on the active portions 103a-1, 103b-2, 103b-3 and 103a-4, respectively. The plurality of channel portions 123 included in each of the gate electrodes 120 may be arranged in a row along the first direction.

Each of the channel portions 123 may have a ring-shaped structure that has a region surrounded by the ring-shaped structure. Thus, each of the channel portions 123 may have inner sidewalls adjacent to the inner space, and outer sidewalls opposite to the inner sidewalls. In an embodiment, the inner sidewalls of the channel portion 123 may constitute a quadrangle when viewed from a plan view. Also, the outer sidewalls of the channel portion 123 may constitute a quadrangle when viewed from a plan view.

A width of each of the channel portions 123 of the first direction may be less than that of each of the active portions 103a-1, 103b-2, 103b-3 and 103a-4 of the first direction. For example, the width of each of the channel portions 123 may have a value of W1. Each of the first active portions 103a-1 and 103a-4 may have the width of W2, which is larger than that of W1. Each of the second active portions 103b-2 and 103b-3 may have the width of W3, which is larger than that of W1.

Referring to FIG. 1A, the connecting portions 125 may have line shapes running in the first direction. Each of connecting portions 125 may connect two neighboring channel portions 123. The channel portions 123 may be arranged in a row along the first direction connected by the connecting portions 125. The channel portions 123 and the connecting portions 125 may form each of the gate electrodes 120, and may be alternately arranged along the first direction.

First impurity doped regions 105a may be disposed in the active portions 103a-1 and 103a-4 and 103b-2 and 103h-3. Each of first impurity dope regions 105 may be form in a region surround by a ring-shaped structure of the channel portions 123, respectively. In an embodiment, since the first impurity doped regions 105a may be surrounded by the ring-shaped structure of the channel portions 123, the first impurity doped regions 105a may avoid contacting the device isolation pattern 101, preventing a punch-through phenomenon along interface of the device isolation pattern 101.

Second impurity doped regions 105b may be disposed in the active portions 130a-1, 130b-2, 130b-3 and 130a-4 outside the channel portions 123, respectively. The second impurity doped regions 105b may be separated from the first impurity doped regions 105a by the channel portions 123. That is, the channel portions 123 may be disposed between the first impurity doped regions 105a and the second impurity doped regions 105b, respectively.

A gate dielectric pattern 110 may be disposed between each of the gate electrodes 120 and the active portions 103a and 103b. The gate dielectric pattern 110 may include at least one of oxide, nitride, oxynitride, and a high-k dielectric material. The high-k dielectric material may include an insulating material having a dielectric constant higher than that of nitride. For example, the high-k dielectric material may include at least one of a metal oxide (e.g. hafnium oxide or aluminum oxide, etc), a metal-semiconductor-oxygen compound (e.g. hafnium-silicon-oxygen compound, etc), and a metal-semiconductor—oxygen-nitrogen compound (e.g. hafnium-silicon-oxygen-nitrogen compound, etc).

A first interlayer dielectric layer 130 may be disposed on the substrate 100. The first interlayer dielectric layer 130 may be single-layered or multi-layered one. The first interlayer dielectric layer 130 may include at least one of an oxide layer, a nitride layer, and an oxynitride layer.

Bit line contact plugs 135 may be disposed on the active portions 103a-1, 103b-2, 103b-3 and 103a-4, respectively. Each of the bit line contact plugs 135 may electrically connect to each of the first impurity doped regions 105a surrounded by the ring-shaped structure of the channel portions 123. In an embodiment, each of the bit line contact plugs 135 may penetrate the first interlayer dielectric layer 130 to directly contact each of the first impurity doped regions 105a. The bit line contact plugs 135 may include at least one of a doped semiconductor material (e.g. doped poly silicon, etc), a metal-semiconductor compound (e.g. a metal silicide, etc), a conductive metal nitride (e.g. titanium nitride, tantalum nitride, or tungsten nitride, etc), and metal (e.g. titanium, tungsten, or tantalum, etc).

First bit lines 140*a*-U and 140*a*-L and second bit lines 140*b*-U and 140*b*-L may be formed on the first interlayer dielectric layer 130, running in parallel along the first direction. The bit lines 140*a*-U, 140*a*-L, 140*b*-U and 140*b*-L may include at least one of a doped semiconductor material (e.g. doped poly silicon, etc), a metal-semiconductor compound (e.g. a metal silicide, etc), a conductive metal nitride (e.g. titanium nitride, tantalum nitride, or tungsten nitride, etc), and metal (e.g. titanium, tungsten, or tantalum, etc).

Referring to FIG. 1B, each of the first bit lines 140*a*-U and 140*a*-L may be electrically connected to each of the bit line contact plugs 135 disposed on the first active portions 103*a*-1 and 103*a*-4. For example, one of the first bit line 140*a*-U may have a line portion running along the first direction and a pad portion protruding to the second direction. The pad portion may be connected to one of the bit line contact plugs 135 on the first active portions 103*a*-1. The other first bit line 140*a*-L may be electrically connected to one of the bit line contact plugs 135 on the first active portions 103*a*-4.

Each of the second bit lines 140*b*-U and 140*b*-L may be electrically connected to each of the bit line contact plugs 135 disposed on the second active portions 103*b*-2 and 103*b*-3 through an assistant pad 155, respectively, using a two-level interconnection. For example, referring to FIG. 1D, one of the second bit line 140*b*-U may be electrically connected to one of the first impurity doped regions 105*a* in the second active portions 103*b*-2, using the bit line contact plug 135 through a first assistant contact plug 151, a second assistant contact plug 153, and an assistant pad 155. In a similar way of FIG. 1D, another second bit line 140*b*-L may be electrically connected to one of the first impurity doped regions 105*a* in the second active portions 103*b*-3, using the bit line contact plug 135 through a first assistant contact plug 151, a second assistant contact plug 153, and an assistant pad 155.

A second interlayer dielectric layer 150 may be disposed on the first interlayer dielectric layer 130. The second interlayer dielectric layer 150 may be single-layered or multi-layered one. The second interlayer dielectric layer 150 may include at least one of an oxide layer, a nitride layer and an oxynitride layer.

First assistant contact plugs 151 may be disposed on the second bit lines 140*b*-U and 140*b*-L, respectively. Second assistant contact plugs 153 may be disposed on the bit line contact plugs 135, respectively. The first assistant contact plugs 151 and the second assistant contact plugs 153 may include at least one of a doped semiconductor material (e.g. doped poly silicon, etc), a metal-semiconductor compound (e.g. a metal silicide, etc) a conductive metal nitride (e.g. titanium nitride, tantalum nitride, or tungsten nitride, etc), and metal (e.g. titanium, tungsten, or tantalum, etc).

Each of the second assistant contact plugs 153 may electrically connect to each of the bit line contact plugs 135 disposed on the first impurity regions 105*b*, respectively. Each of the first assistant contact plugs 151 may penetrate the second interlayer dielectric layer 150 to directly contact each of the second bit lines 140*b*. Each of the second assistant contact plugs 153 may penetrate the second interlayer dielectric layer 150 to directly contact each of the bit line contact plugs 135 disposed on the first impurity regions 105*b*, respectively.

Assistant pads 155 may be disposed on the second interlayer dielectric layer 150. Each of the assistant pads 155 may electrically connect one of the first assistant contact plugs 151 and one of the second assistant contact plugs 153. Each of the assistant pads 155 may have a line shape running along the second direction. The assistant pads 155 may include at least one of a doped semiconductor material (e.g. doped poly silicon, etc), a metal-semiconductor compound (e.g. a metal silicide, etc), a conductive metal nitride (e.g. titanium nitride, tantalum nitride, or tungsten nitride, etc), and metal (e.g. titanium, tungsten, or tantalum, etc).

The second bit lines 140*b*-U and 140*b*-L may be electrically connected to the bit line contact plug 135 on the second active portions 103*b*-2 and 103*b*-3 through the first assistant contact plug 151, the second assistant contact plug 153, and the assistant pad 155.

However, in the semiconductor device according to embodiments of the inventive concept, the first and second bit lines 140*a*-U and 140*a*-L and 140*b*-U and 140*b*-L, and the bit line contact plugs 135 are not limited to the structures described above. In some embodiments, the first and second bit lines 140*a*-U and 140*a*-L and 40*b*-U and 140*b*-L, and the bit line contact plugs 135 may have various structures of interconnection.

First source contact plugs 157 may be disposed on the second impurity doped regions 105*b*, respectively. In an embodiment, the first source contact plugs 157 may penetrate the second and first interlayer dielectric layers 150 and 130 to directly contact the second impurity doped regions 105*b*. The first source contact plugs 157 may include at least one of a doped semiconductor material (e.g. doped poly silicon, etc), a metal-semiconductor compound (e.g. a metal silicide, etc), a conductive metal nitride (e.g. titanium nitride, tantalum nitride, or tungsten nitride, etc), and metal (e.g. titanium, tungsten, or tantalum, etc).

The first source contact plugs 157 may be two-dimensionally arranged in a plurality of rows and in a plurality of columns when viewed from a plan view. The first source contact plugs 157 in rows may be disposed in parallel along the first direction, and the first source contact plugs 157 in columns may be disposed in parallel along the second direction. The first source contact plugs 157 may be disposed on the active portions 103*a*-1, 103*b*-2, 103*b*-3 and 103*a*-4. That is, each of the first source contact plugs 157 in each of the rows may be electrically connected to the second impurity doped region 105*b* of the active portions 103*a*-1, 103*b*-2, 103*b*-3 and 103*a*-4. A plurality of the first source contact plugs 157 in each of the columns may be disposed on each of the active portions 103*a*-1, 103*b*-2, 103*b*-3 and 103*a*-4 to be connected to the second impurity doped region 105*b*.

Portions of the second impurity doped region 105*b* being respectively connected to the first source contact plugs 157 in each of the columns may be laterally separated from each other by the connecting portions 125 of the gate electrodes 120.

The channel portion 123 of the gate electrode 120 may be disposed between a pair of the first source contact plugs 157 adjacent to each other within each of the columns.

Conductive pads 163 may be disposed on the second interlayer dielectric layer 150 to be electrically connected to the first source contact plugs 157, respectively. Each of the conductive pads 163 may have a line shape running along the first direction. In an embodiment, a width of each of the conductive pads 163 along the first direction may be greater than the width W1 of the channel portion 123 along the first direction. The conductive pads 163 may include at least one of a doped semiconductor material (e.g. doped poly silicon, etc), a metal-semiconductor compound (e.g. a metal silicide, etc), a conductive metal nitride (e.g. titanium nitride, tantalum nitride, or tungsten nitride, etc), and metal (e.g. titanium, tungsten, or tantalum, etc).

A third interlayer dielectric layer 160 may be disposed on the second interlayer dielectric layer 150. The third interlayer dielectric layer 160 may be single-layered or multi-layered one. The third interlayer dielectric layer 160 may include at least one of an oxide layer (e.g. silicon oxide layer), a nitride layer (e.g. a silicon oxide layer), and an oxynitride layer (e.g. a silicon oxynitride layer).

Via contact plugs 167 may be electrically connected to each of the conductive pads 163, respectively. The via contact plugs 167 may penetrate the third interlayer dielectric layer 160 to directly contact the conductive pads 163. The via contact plugs 167 may include at least one of a doped semiconductor material (e.g. doped poly silicon, etc), a metal-semiconductor compound (e.g. a metal silicide, etc), a conductive metal nitride (e.g. titanium nitride, tantalum nitride, or tungsten nitride, etc), and metal (e.g. titanium, tungsten, or tantalum, etc).

In an embodiment, the via contact plugs 167 may be two-dimensionally arranged both in a plurality of rows and in a plurality of columns. A pair of columns of via contact plugs 167 may be disposed over each of the active portion 103*a*-1, 103*b*-2, 103*b*-3 and 103*a*-4.

Second source contact plugs 165 may be disposed on the second impurity doped regions 105*b*. The second source contact plugs 165 are electrically separated from the gate electrodes 120. In an embodiment, the second source contact plugs 165 may penetrate the third, second, and first interlayer dielectric layers 160, 150, and 130 to directly contact the second impurity doped regions 105*b*. Each of the second source contact plug 165 may be disposed between a pair of the via contact plugs 167 adjacent to each other in the second direction when viewed from a plan view. In an embodiment, each of the channel portions 123 may be disposed between a pair of the second source contact plugs 165 that are arranged in the first direction and adjacent to each other when viewed from a plan view. The second source contact plugs 165 may include at least one of a doped semiconductor material (e.g. doped poly silicon, etc), a metal-semiconductor compound (e.g. a metal silicide, etc), a conductive metal nitride (e.g. titanium nitride, tantalum nitride, or tungsten nitride, etc), and metal (e.g. titanium, tungsten, or tantalum, etc).

Metal wires 170 may be disposed on the third interlayer dielectric layer 160. The metal wires 170 may have line shapes running along the second direction and being in parallel to each other, being connected to the via contact plugs 167. A pair of the metal wires 170 may run across each of the active portions 103*a*-1, 103*b*-2, 103*b*-3 and 103*a*-4 along the second direction. The pair of metal wires 170 disposed over each of the active portions 103*a*-1, 103*b*-2, 103*b*-3 and 103*a*-4 may be electrically connected to each other through the via contact plugs 167 and the conductive pads 163 over each of the first and second active portions 103*a*-1, 103*b*-2, 103*b*-3 and 103*a*-4.

However, the first source contact plugs 157, the second source contact plugs 165 and the metal wires 170 are not limited to the structures described above. The first source contact plugs 157, the second source contact plugs 165 and the metal wires 170 may have various shapes. The first source contact plugs 157, the second source contact plugs 165 and the metal wires 170 may be electrically connected to the second impurity doped region 105*b* using various structures of interconnection. For example, the via contact plugs 167 and the conductive pads 163 may be omitted or replaced with other structures.

According to embodiments of the inventive concept, the gate electrodes 120 may include the channel portions 123 having a ring-shaped structure and the connecting portions 125 connecting two neighboring channel portions 123. The first impurity doped regions 105*a* may be disposed in the region surrounded by the ring-shaped structure of the channel portions 123. Thus, the first impurity doped regions 105*a* may avoid contacting the device isolation pattern 101 defining the active portions 103*a*-1, 103*h*-2, 103*b*-3 and 103*a*-4. As a result, such physical separation of the first impurity dope regions 105*a* from the device isolation pattern 101 may prevent activated charges (e.g. electrons) of the first impurity doped regions 105*a* from being trapped in sidewalls of the device isolation pattern 101 and thus prevent a punch-through phenomenon along the sidewalk of the device isolation pattern 101. Thus, the semiconductor device with improved reliability may be realized.

Also, each of the second impurity doped regions 105*b* may be disposed in each of the active portions 103*a*-1, 103*b*-2, 103*b*-3 and 103*a*-4 and may be disposed outside of the channel portions 123. As a result, the channel portions 123 may operate as a transistor whose channel width amounts to perimeter of the ring-shaped structure and whose length amounts to width of the ring-shaped structure, because the channel portions 123 have the first impurity regions at its center and have the second impurity regions surrounding the channel portions 123. Thus, the larger widths of the second impurity doped regions 105*b*, the more the semiconductor device becomes reliable in electrical characteristics.

A method of forming a semiconductor device according to embodiments of the inventive concept will be described below. FIGS. 2A to 7A are plan views illustrating a method of forming a semiconductor device according to embodiments of the inventive concept. FIGS. 2B to 7B are cross sectional views taken along lines I-I' of FIGS. 2A to 7A, respectively, and FIGS. 2C to 7C are cross sectional views taken along lines II-II' of FIGS. 2A to 7A, respectively. FIGS. 4D to 7D are cross sectional views taken along lines III-III' of FIGS. 4A to 7A, respectively, and FIG. 7E is a cross sectional view taken along a line IV-IV' of FIG. 7A.

Figure 2A:
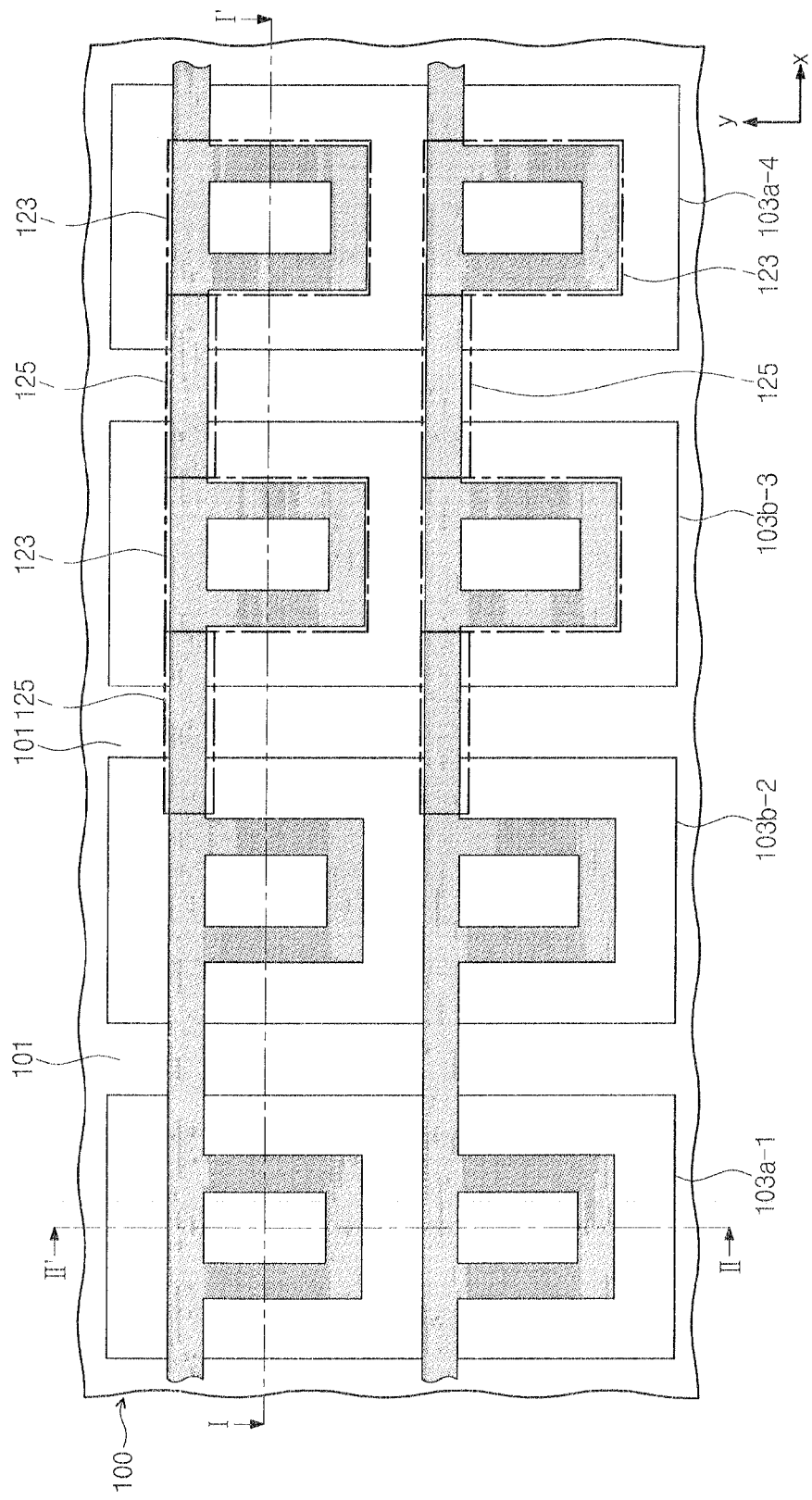
Figure 2B:
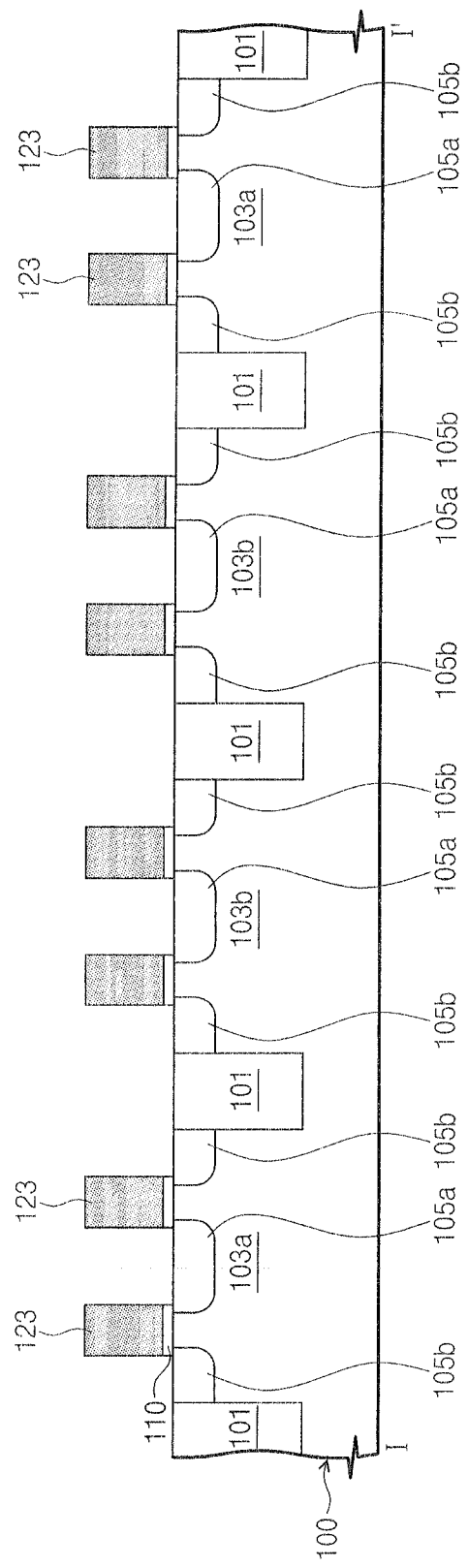
Figure 2C:
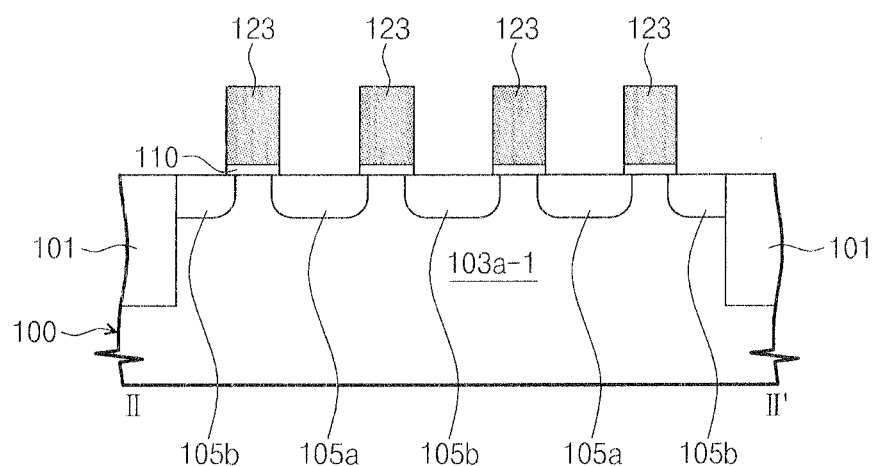

Referring to FIGS. 2A, 2B, and 2C, a device isolation pattern 101 may be formed in a substrate 100 to define active portions 103*a*-1, 103*b*-2, 103*b*-3 and 103*a*-4. In an embodiment, a portion of the substrate 100 may be etched to form a trench, and then the trench may be filled with a dielectric material to form the device isolation pattern 101. For example, the device isolation pattern 101 may include at least one of an oxide layer, a nitride layer, or an oxynitride layer.

The active portions 103*a*-1, 103*b*-2, 103-3 and 103*a*-4 may be arranged in a row along a first direction. The pair of second active portions 103*b*-2 and 103*b*-3 may be disposed between the pair of first active portions 103*a*-1 and 103*a*-4. That is, the pair of second active portions 103*b*-2 and 103*b*-3 may be adjacent each other, and the pair of first active portions 103*a*-1 and 103*a*-4 may be separated one another by the pair of second active portions 103*b*-2 and 103*b*-3. The first direction may be parallel to an x-axis of FIG. 2A.

A pair of gate electrodes 120 may be formed on the substrate 100, and gate dielectric patterns 110 may be formed between the gate electrodes 120 and the active portions 103*a*-1, 103*b*-2, 103*b*-3 and 103*a*-4. The gate electrodes 120 may run across the active portions 103*a*-1, 103*b*-2, 103*b*-3 and 103*a*-4 and the device isolation pattern 101 along the first direction.

A gate dielectric layer may be formed on the substrate 100 and then the gate dielectric layer may be patterned to form the gate dielectric patterns 110. The gate dielectric layer may be formed by a chemical vapor deposition (CVD) process, an atomic layer deposition (ALD) process, and a thermal oxidation process.

A gate conductive layer may be formed on the substrate 100 and then the gate conductive layer may be patterned to form the gate electrodes 120. The gate conductive layer may be single-layered or multi-layered. For example, the gate conductive layer may include at least one of a metal-semiconductor compound layer or a metal layer. The gate conductive layer may be formed by a chemical vapor deposition (CVD) process, an atomic layer deposition (ALD) process, and a physical vapor deposition (PVD) process.

In an embodiment, the patterning of the gate dielectric layer and the patterning of the gate conductive layer may be performed in a single process chamber. That is, the gate dielectric layer and the gate conductive layer may be sequentially formed, a mask pattern may be formed on the conductive layer, and the gate conductive layer and the gate dielectric layer may be etched using the same mask pattern as an etching mask in the single process chamber. Thus, the gate dielectric patterns 110 and the gate electrodes 120 may be formed using the same mask pattern. However, the formation methods of the gate dielectric patterns 110 and the gate electrodes 120 are not limited to the method described above. The gate dielectric patterns 110 and the gate electrode 120 may be formed by various methods.

Each of the gate electrodes 120 of FIG. 2A may be formed to have a plurality of channel portions 123 and a plurality of connecting portions 125. The plurality of channel portions 123 may be disposed on the active portions 103a-1, 103b-2, 103b-3 and 103a-4, respectively. For example, each of the gate electrodes 120 may include four channel portions 123 which are disposed on the pair of first active portions 103a-1 and 103a-4 and the pair of second active portions 103b-2 and 103b-3, respectively. The plurality of channel portions 123 included in each of the gate electrodes 120 may be arranged in a row along the first direction.

Each of the channel portions 123 may have a ring-shaped structure. Each of the connecting portions 125 may have a line shape structure, connecting neighboring channel portions 123. The channel portions 123 may be connected to each other through the connecting portions 125, thereby constituting each of the gate electrodes 120.

First impurity doped regions 105a and second impurity doped regions 105b may be formed by injecting impurities into the active portions 103a-1, 103b-2, 103b-3 and 103a-4 of the substrate 100 having the gate electrodes 120. The second impurity doped regions 105b may be spaced apart from the first impurity doped regions 105a by the channel portions 123. Each of the first impurity doped regions 105a may be formed in a region surrounded by the ring-shaped structure of the channel portions 123 in a plan view. Thus, the first impurity doped regions 105a may be spaced apart from the device isolation pattern 101. Each of the second impurity doped regions 105b may be formed in each of the active portions 103a-1, 103b-2, 103b-3 and 103a-4 outside the gate electrodes 120 when viewed from a plan view.

Figure 3A:
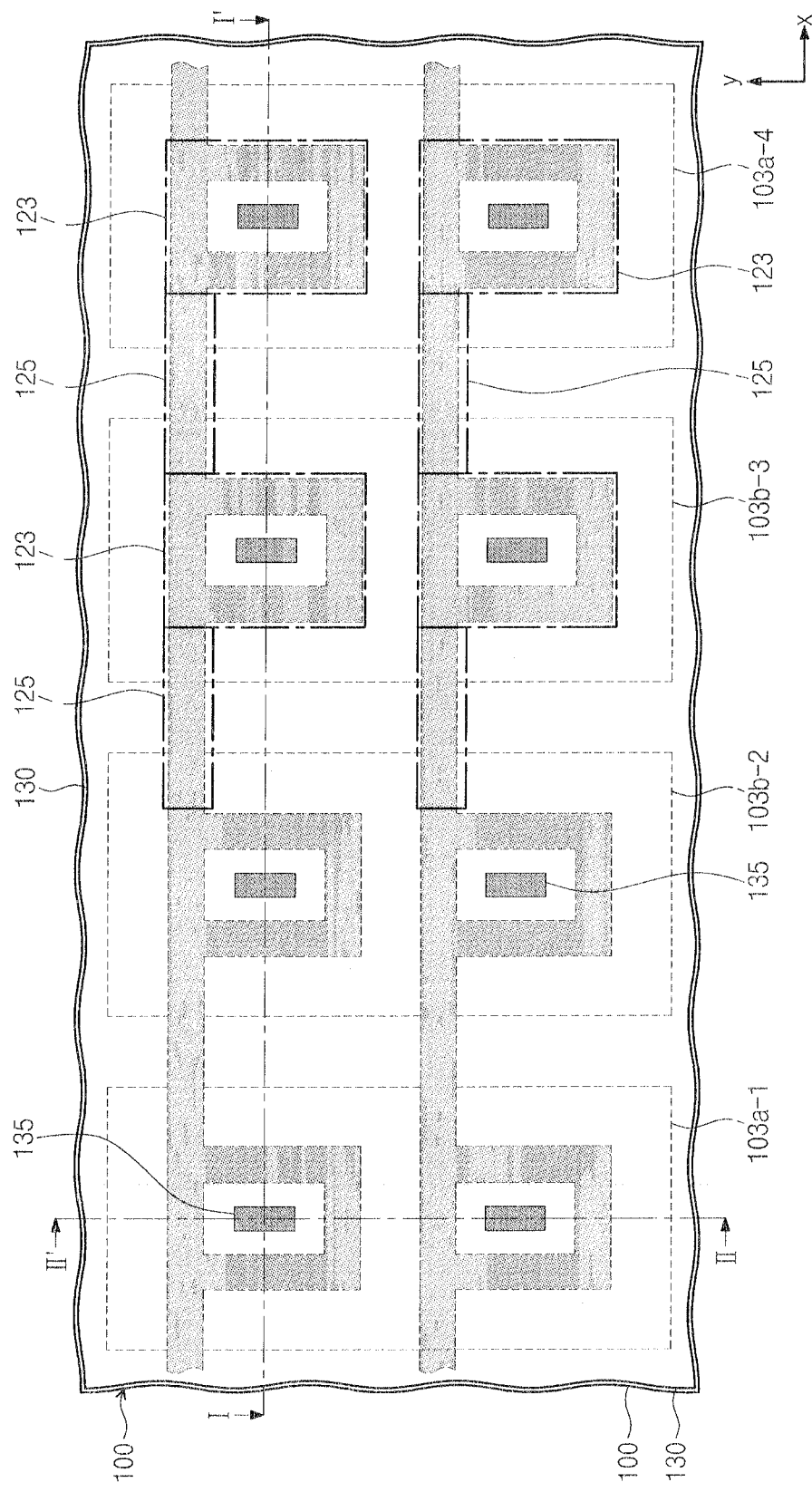
Figure 3B:
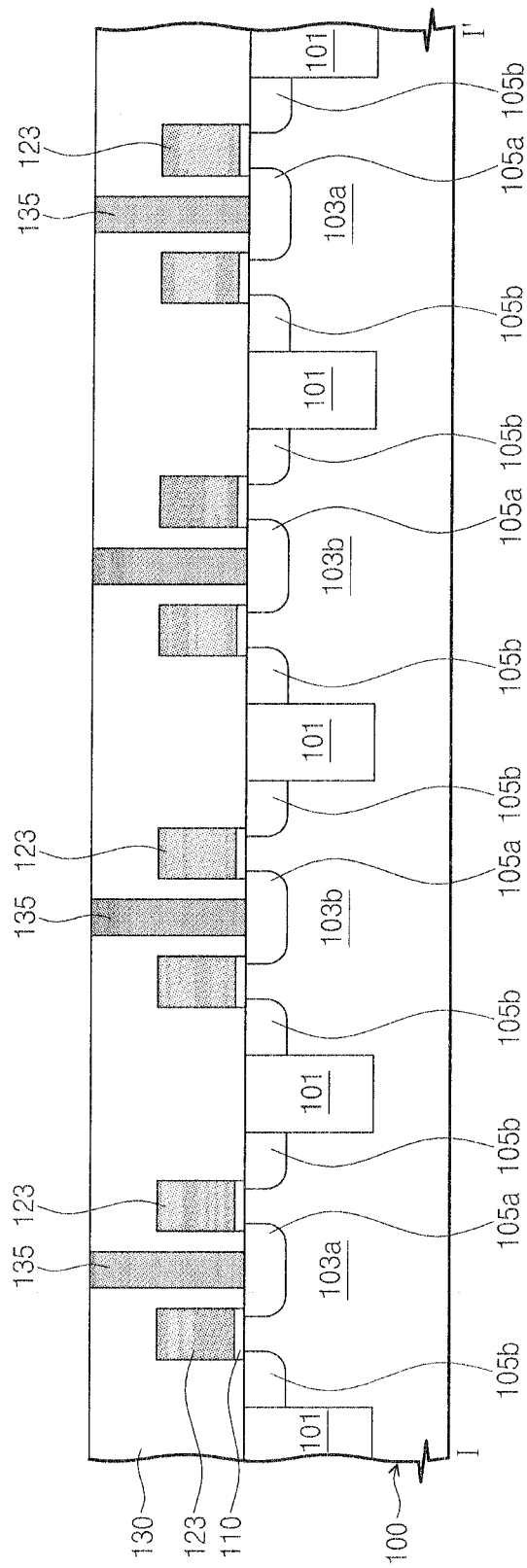
Figure 3C:
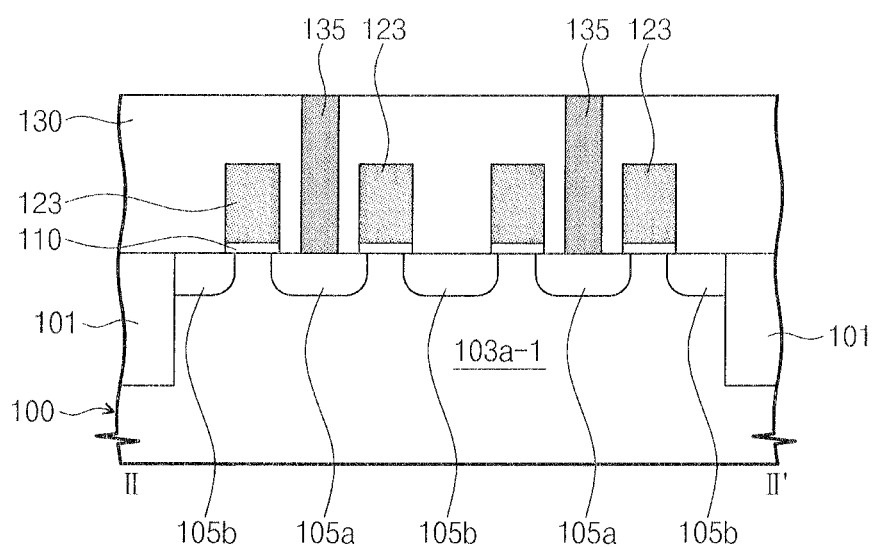
Figure 4B:
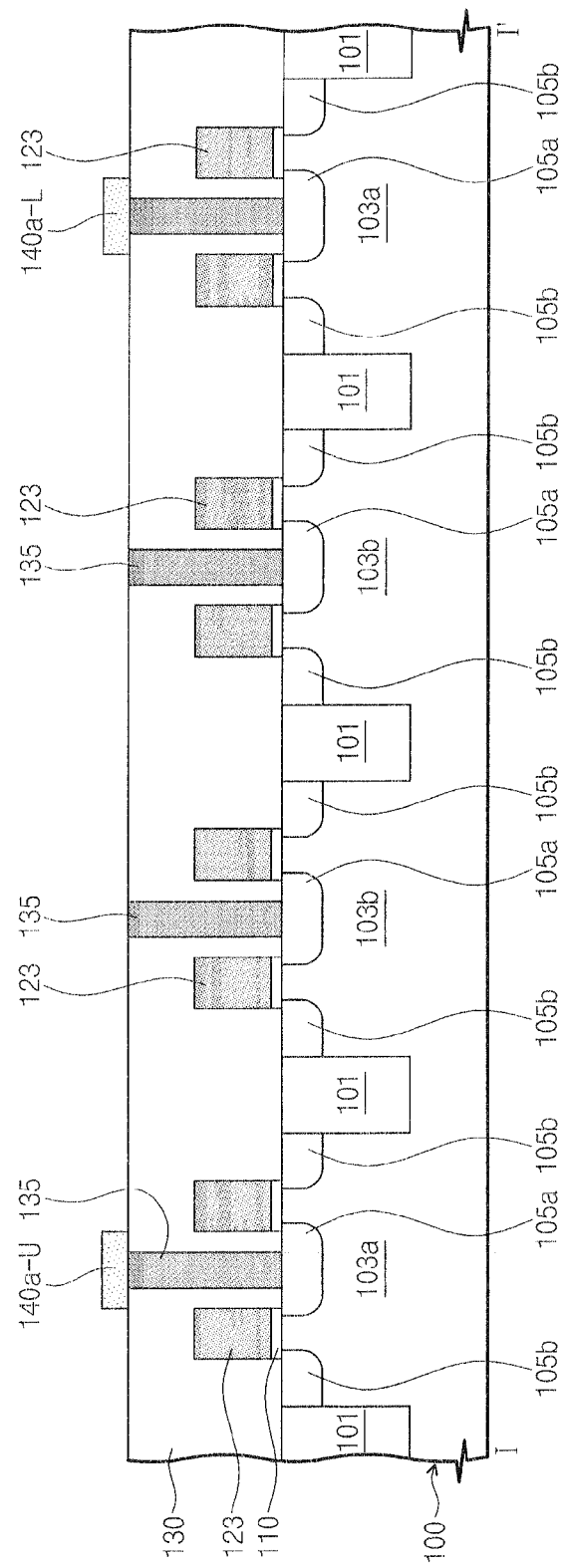
Figure 4C:
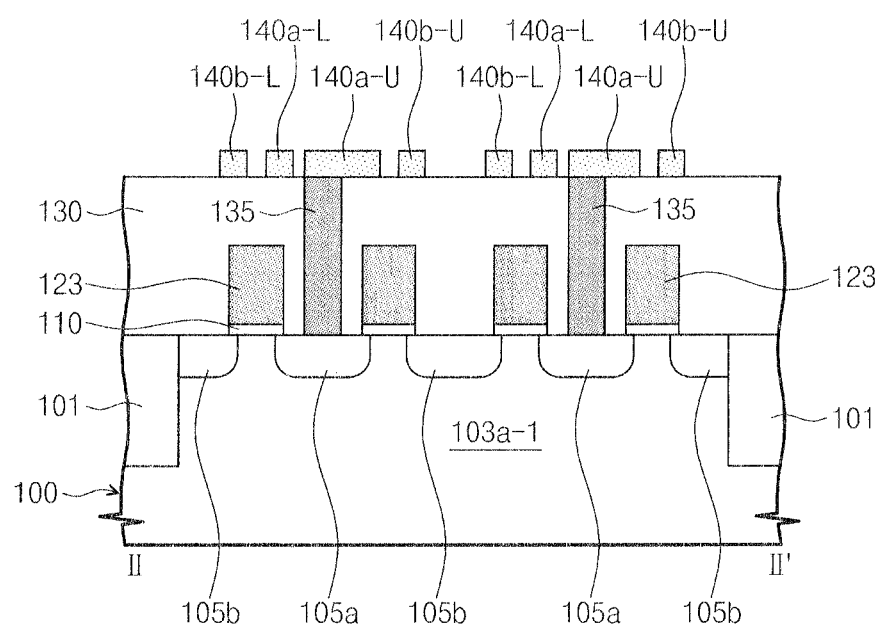
Figure 4D:
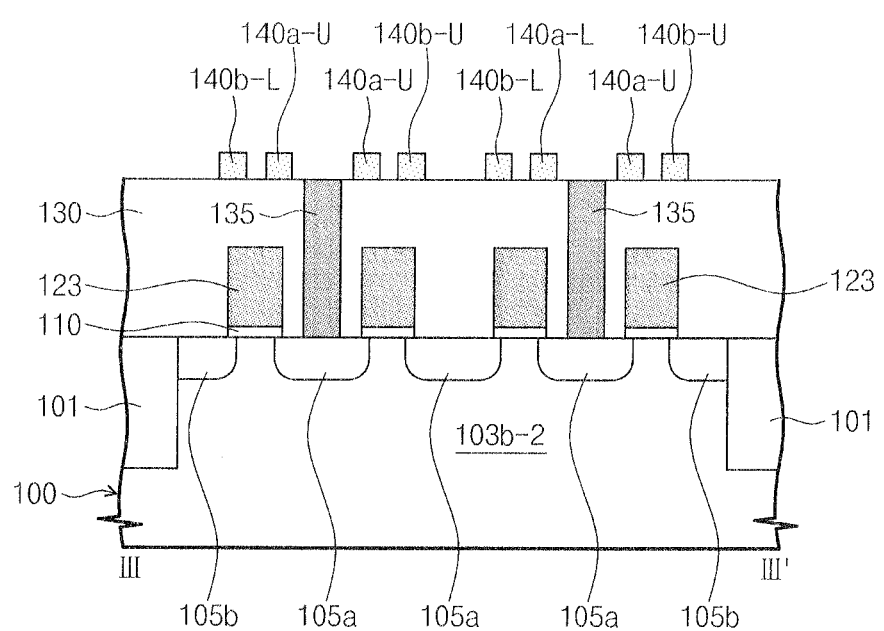
Figure 5A:
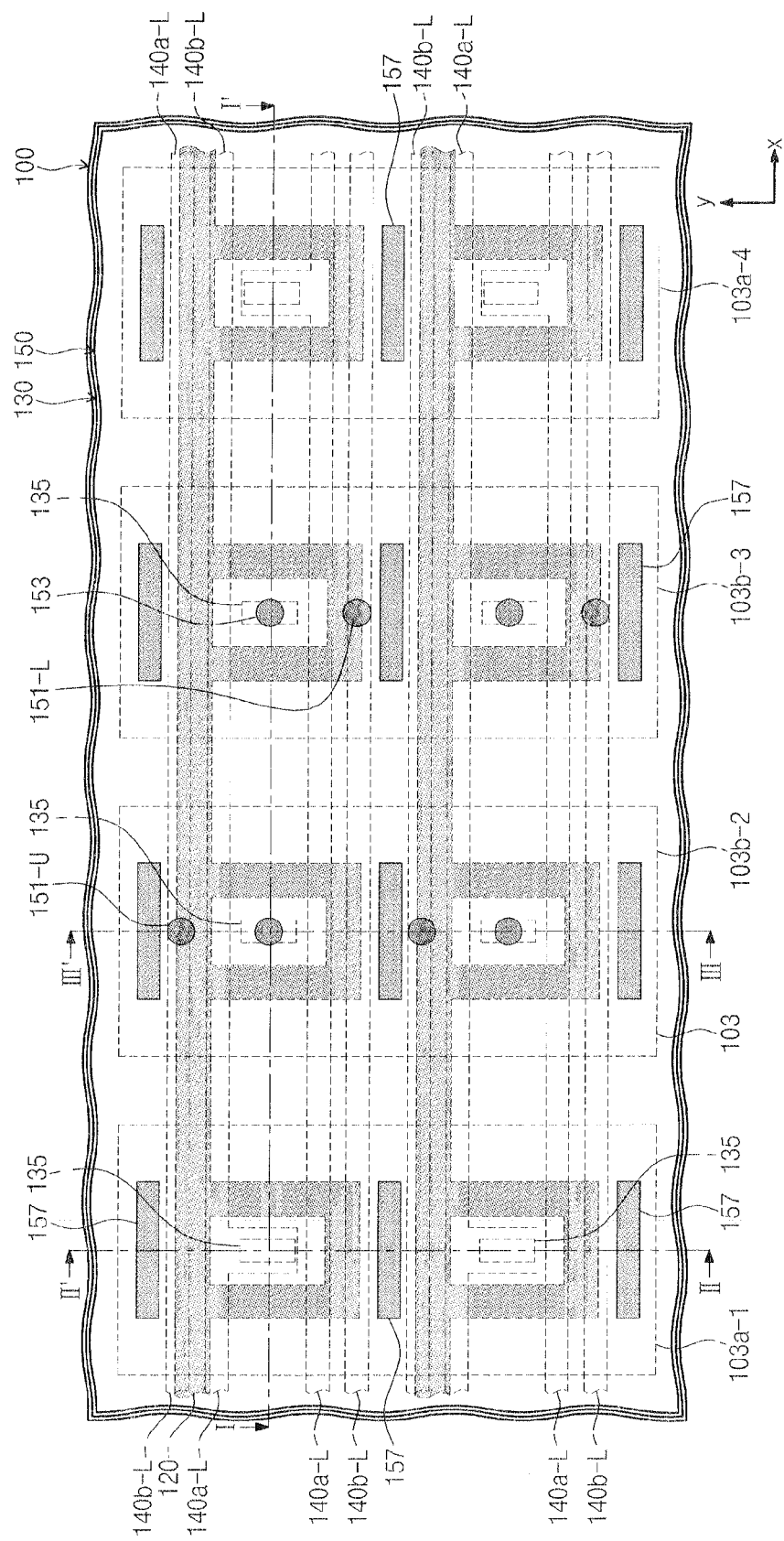
Figure 5B:
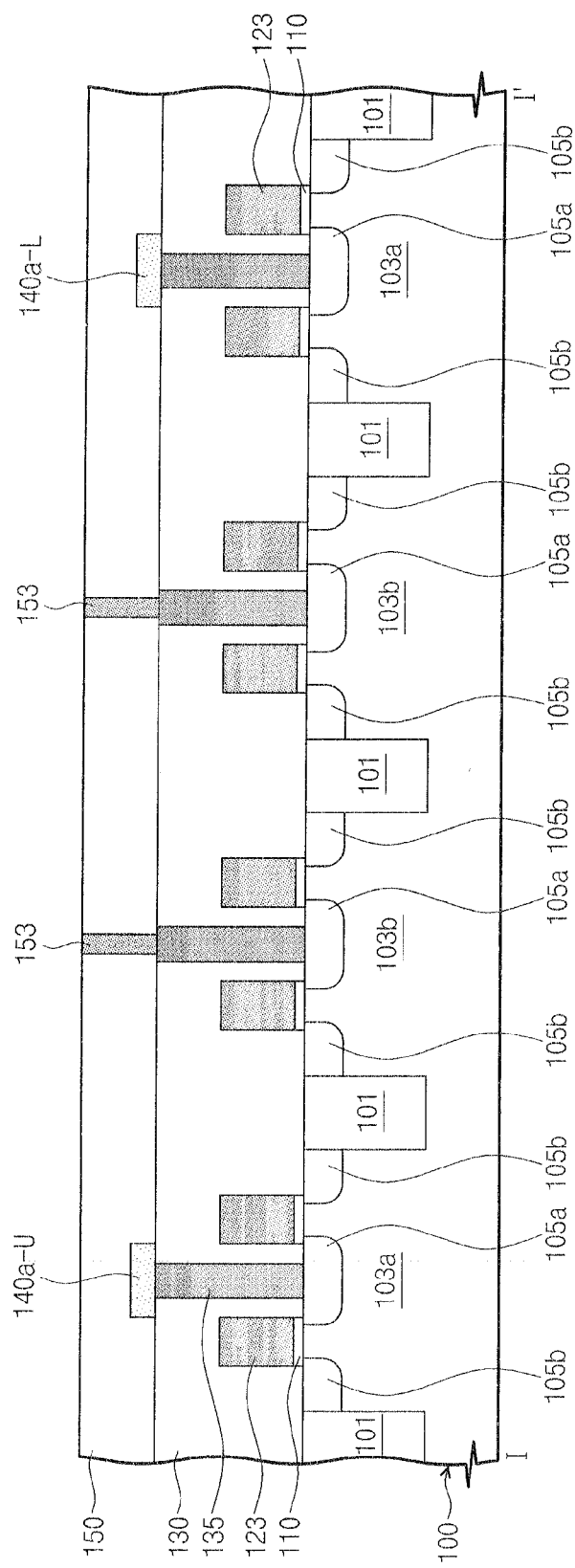
Figure 5C:
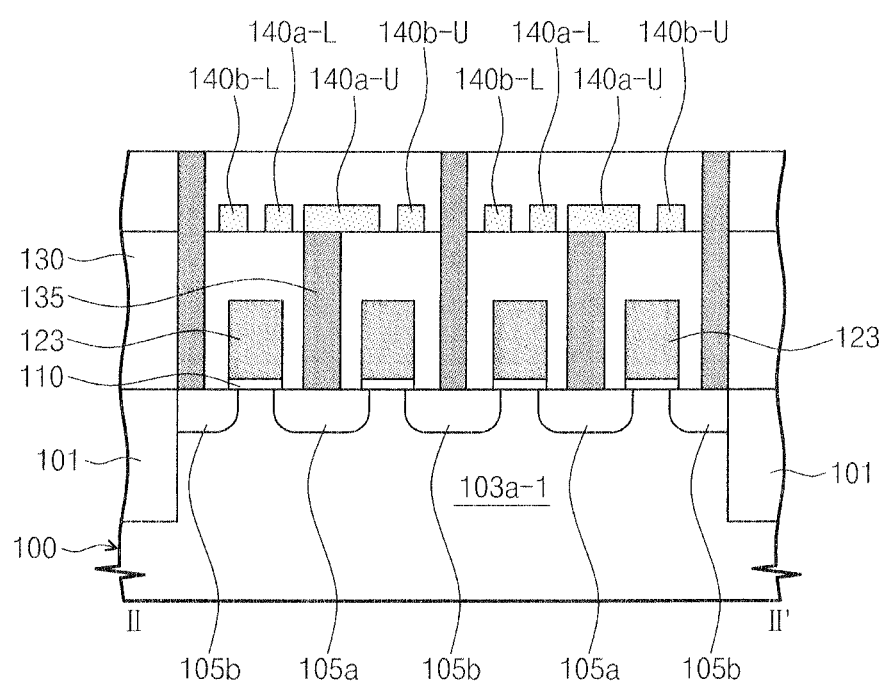
Figure 5D:
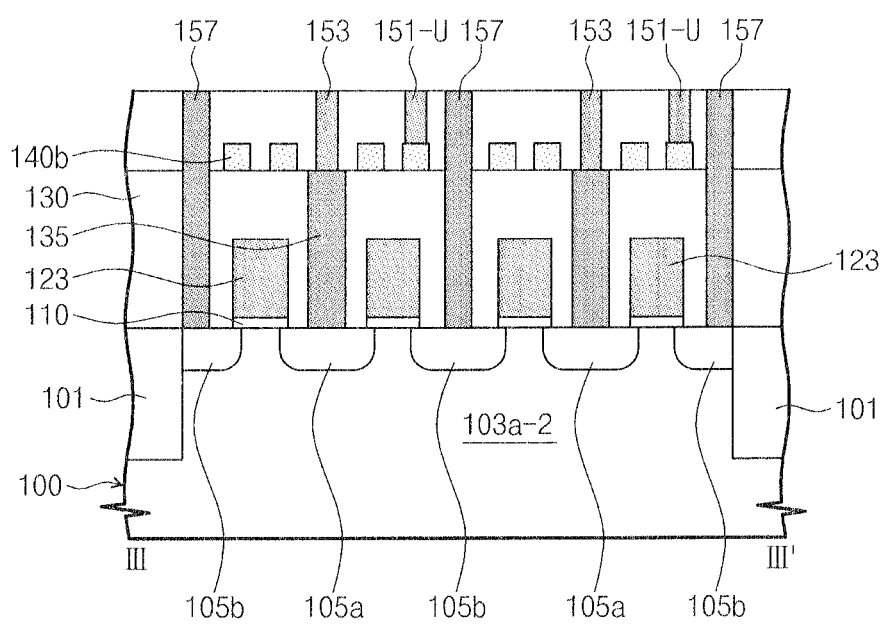
Figure 6A:
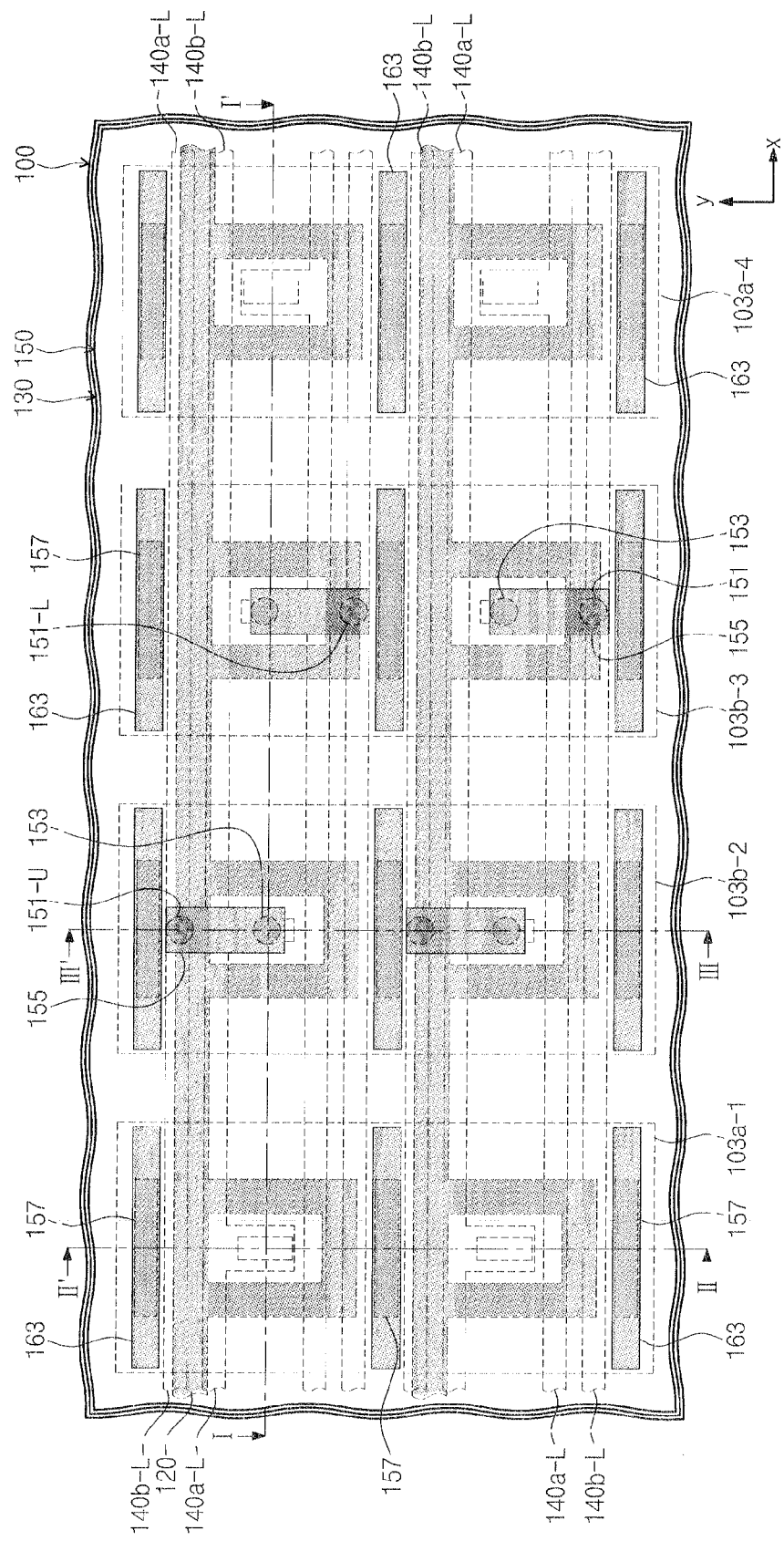
Figure 6B:
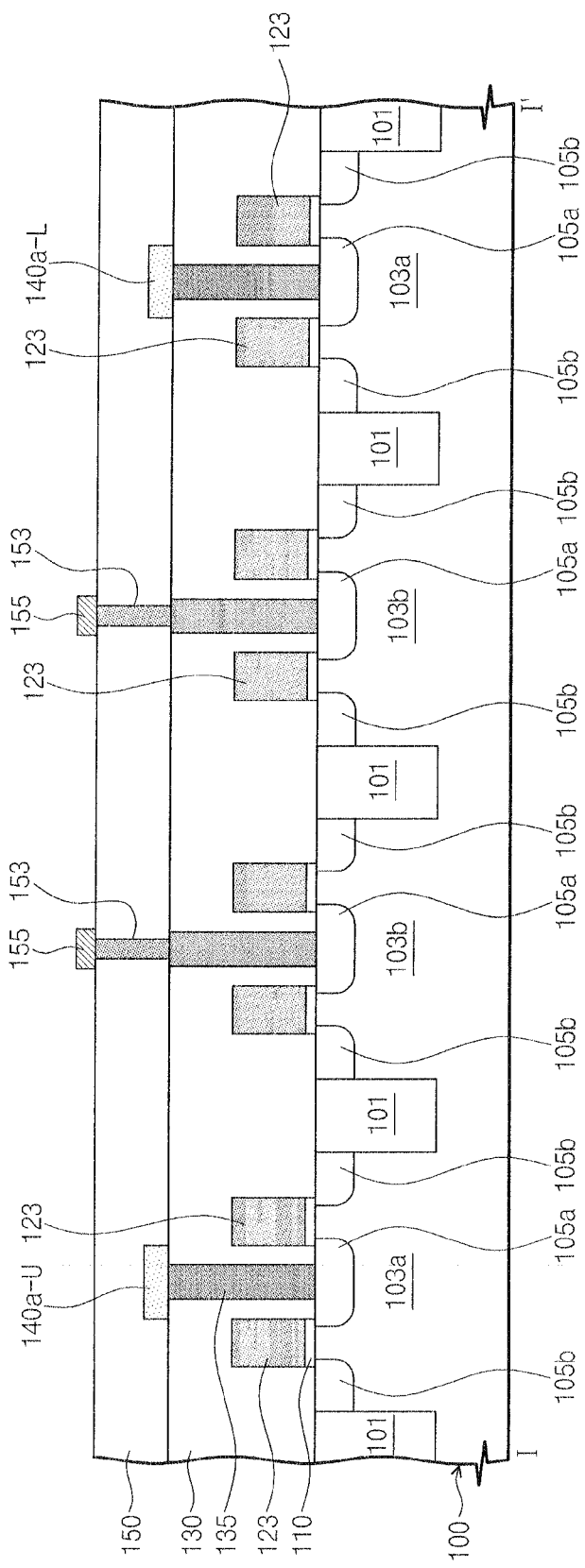
Figure 6C:
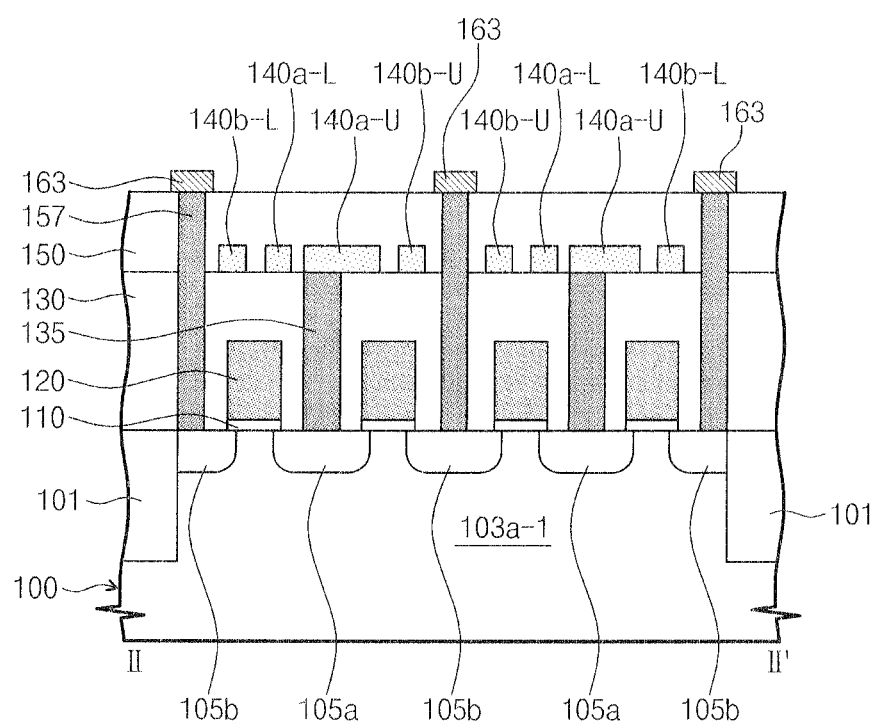
Figure 6D:
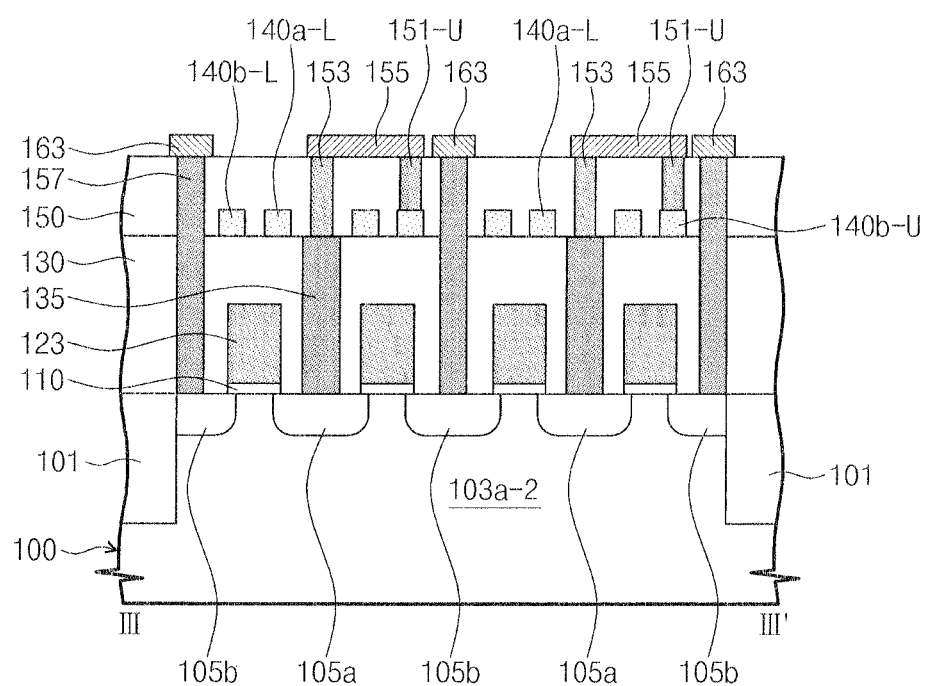

Referring to FIGS. 3A, 3B, and 3C, a first interlayer dielectric layer 130 and bit line contact plugs 135 may be formed on the first substrate 100. The first interlayer dielectric layer 130 may be formed by a chemical vapor deposition (CVD) process, an atomic layer deposition (ALD) process, and a physical vapor deposition (PVD) process.

Each of the bit line contact plugs 135 may be electrically connected to each of the first impurity doped regions 105a. In an embodiment, a bit line contact hole may be formed in the first interlayer dielectric layer 130 to expose at least a portion of each of the first impurity doped regions 105a, and then a conductive material may fill the bit line contact hole to form the bit line contact plug 135.

Referring to FIGS. 4A, 4B, 4C, and 4D, first bit lines 140a-U and 140a-1, and second bit lines 140b-U and 140b-L may be formed on the first interlayer dielectric layer 130. A bit line conductive layer may be formed on the first interlayer dielectric layer 130 and then the bit line conductive layer may be patterned to form the first bit lines 140a-U and 140a-L and the second bit lines 140-U and 140b-L.

The first bit lines 140a-U and 140a-L may be electrically connected to each of the bit line contact plugs 135 disposed on the first active portions 103a-1 and 103a-4. For example, one of the first bit line 140a-U may have a line portion running along the first direction and a pad portion protruding to the second direction. The pad portion may be connected to one of the bit line contact plugs 135 on the first active portions 103a-1. The other first bit line 140a-L may be electrically connected to one of the bit line contact plugs 135 on the first active portions 103a-4. At this process stage, the bit line contact plugs 135 on the second active portions 130b-2 and 130b-3 may not be connected to the second bit lines 140b-U and 140b-L, respectively. A further process of forming an interconnection may be necessary to connect the second bit lines 140b-U and 140b-L and the bit line contact plugs 135 on the second active portions 130b-2 and 130b-3. Such process will be explained below.

Referring to FIGS. 5A, 5B, 5C, and 5D, a second interlayer dielectric layer 150, first assistant contact plugs 151-U and 151-L, second assistant contact plugs 153, and first source contact plugs 157 may be formed on the substrate 100. The second interlayer dielectric layer 150 may be formed by a chemical vapor deposition (CVD) process, an atomic layer deposition (ALD) process, and a physical vapor deposition (PVD) process.

The second interlayer dielectric layer 150 may be etched to form first assistant contact holes and second assistant contact holes, and then a conductive material may fill in each of the first and second assistant contact holes to form the first assistant contact plugs 151-U and 151-L and the second assistant contact plugs 153. In an embodiment, each of the first assistant contact holes may expose at least a portion of each of the second bit lines 140b. And, each of the second assistant contact holes may expose at least a portion of each of the bit line contact plugs 135 disposed on the second active portions 103b-2 and 103b-3.

In an embodiment, the first assistant contact plugs 151-U and 151-L and second assistant contact plugs 153 may be formed over the second active portions 103b-2 and 103b-3.

First source contact holes may be formed in the second and first interlayer dielectric layers 150 and 130 by an etching process, and then a conductive material may fill in each of the first source contact holes to form the first source contact plugs 157. The first source contact holes may expose at least portions of the second impurity doped regions 105b in the active portions 103a-1, 103b-2, 103b-3 and 103a-4, respectively.

In an embodiment, the first assistant contact holes, the second assistant contact holes, and the first source contact holes may be formed simultaneously. Alternatively, the first assistant contact holes, the second assistant contact holes, and the first source contact holes may be formed by using different etching processes.

Referring to FIGS. 6A, 613, 6C, and 6D, assistant pads 155-U and 155-L and conductive pads 163 may be formed on the second interlayer dielectric layer 150. Each of the assistant pad 155-U may be formed to electrically connect each of the first assistant contact plugs 151-U and each of the second assistant contact plugs 153. Each of the assistant pad 155-L may be formed to electrically connect each of the first assistant contact plugs 151-L and each of the second assistant contact plugs 153. The conductive pads 163 may be formed to be electrically connected to the first source contact plugs 157, respectively. A conductive layer may be formed on the second interlayer dielectric layer 150, and then the conductive layer may be patterned to form the assistant pads 155 and the conductive pads 163. In an embodiment, the assistant pads 155 and the conductive pads 163 may be formed simultaneously. In this case, the assistant pads 155 and the conductive pads 163 may be formed of the same conductive material. However, methods of forming the assistant pads 155 and the conductive pads 163 are not limited to the method described above. The assistant pads 155 and the conductive pads 163 may be formed by various methods.

Referring to FIGS. 7A, 7B, 7C, 7D, and 7E, a third interlayer dielectric layer 160 may be formed on the second interlayer dielectric layer 150. Via contact plugs 167 may be formed in the third interlayer dielectric layer 160. The via contact plugs 167 may be two-dimensionally arranged both in a plurality of rows and in a plurality of columns. A pair of columns of the via contact plugs 167 may be disposed over each of the active portions 103a-1, 103b-2, 103b-3 and 103a-4. In an embodiment, the via contact plugs 167 may be electrically connected to each of the conductive pads 163, respectively.

Via contact holes may be formed in the third interlayer dielectric layer 160, and then a conductive material may fill each of the via contact holes to form the via contact plugs 167. Each of the via contact holes may expose at least a portion of the conductive pad 163.

Second source contact plugs 165 may be formed on the second impurity regions 105b. Second source contact holes may be formed to penetrate the third, second and first interlayer dielectric layers 160, 150, and 130, and then a conductive material may till each of the second source contact holes to form the second source contact plugs 165. The second source contact holes may be formed by a single etching process. Alternatively, the second source contact holes may be formed by a plurality of etching processes.

Referring to FIGS. 1A to 1E, metal wires 170 may be formed on the third interlayer dielectric layer 160. Each of the metal wires 170 may be electrically connected to the via contact plugs 167 and the second source contact plugs 165. In an embodiment, each of the metal wires may run in parallel along the second direction, connecting the via contact plugs 167 and the second source contact plugs 165. The second source contact plugs 165 may be disposed between the via contact plugs 167 along the second direction of y-axis.

According to embodiments of the inventive concept, the gate electrodes 120 may include the channel portions 123 having a ring-shaped structure and the connecting portions 125 connecting two neighboring channel portions 123. The first impurity doped regions 105a may be disposed in the region surrounded by the ring-shaped structure of the channel portions 123. Thus, the first impurity doped regions 105a may avoid contacting the device isolation pattern 101 defining the active portions 103a-1, 103b-2, 103b-3 and 103a-4. As a result, such physical separation of the first impurity dope regions 105a from the device isolation pattern 101 may prevent activated charges (e.g. electrons) of the first impurity doped regions 105a from being trapped in sidewalls of the device isolation pattern 101 and thus prevent a punch-through phenomenon along the sidewalls of the device isolation pattern 101. Thus, the semiconductor device with improved reliability may be realized.

Each of the second impurity doped regions 105b may be disposed in each of the active portions 103a-1, 103b-2, 103b-3 and 103a-4 and may be disposed outside of the channel portions 123. As a result, the channel portions 123 may operate as a transistor whose channel width amounts to perimeter of the ring-shaped structure and whose length amounts to width of the ring-shaped structure, because the channel portions 123 have the first impurity regions at its center and have the second impurity regions surrounding the channel portions 123. Thus, the larger widths of the second impurity doped regions 105b, the more the semiconductor device becomes reliable in electrical characteristics.

A semiconductor device according to other embodiments of the inventive concept will be described below. FIG. 8A a plan view illustrating a semiconductor device according to other embodiments of the inventive concept. FIG. 8B is a cross section view taken along a line I-I' of FIG. 8A, FIG. 8C is a cross section view taken along a line II-IF of FIG. 8A, and FIG. 8D is a cross section view taken along a line III-III' of FIG. 8A. FIG. 8E is a cross section view taken along a line IV-IV' of FIG. 8A, and FIG. 8F is a cross section view taken along a line V-V' of FIG. 8A.

Referring to FIGS. 8A to 8F, a device isolation pattern 101 may be disposed in a substrate 100 to define a pair of first active portions 103a-1, 103a-4 and a pair of second active portions 103b-2, 103b-3.

A pair of gate electrodes 120a may run across the active portions 103a-1, 103b-2, 103b-3 and 103a-4 and the device isolation along in the first direction. The gate electrodes 120a may include at least one of a semiconductor material doped with dopant (e.g. doped silicon), a conductive metal nitride (e.g. titanium nitride, tantalum nitride, or tungsten nitride), and metal (e.g. ruthenium, iridium, titanium, tungsten or tantalum). Gate dielectric patterns 110 may be disposed between the gate electrodes 120a and the active portions 103a-1, 103b-2, 103b-3 and 103a-4.

Each of the gate electrodes 120a may include a plurality of channel portions 123, a plurality of first connecting portions 125a and a plurality of second connecting portion 125b. The channel portions 123 may have the ring-shape structure of FIGS. 1A to 1E. The first connecting portions 125a and the second connecting portions 125b may be alternately arranged along the first direction.

The channel portion 123 may be disposed between the first connecting portion 125a and the second connecting portions alternately arranged in the first direction. The first connecting portion 125a may connect neighboring channel portions 123 disposed on one of the first active portions 103a-1 and 103a-4 and one of the second active portions 103b-2 and 103b-3, respectively. The second connecting portion 125b may connect neighboring channel portions 123 disposed on the second active portion 103b. The first and second connecting portions 125a and 125b may have various ways of connecting two neighboring channel portions 123 according to a position where the connecting portions 125a and 125b connects two neighboring channel portions 123. For example, each of the first connecting portions 125a connects two neighboring channel portions 123 along imaginary lines running through centers of the two neighboring channel portions. Alternatively, each of the first connecting portions 125a connects two neighboring channel portions 123 along imaginary lines running through sides of the two neighboring channel portions.

Referring to FIG. 8B, each of a second impurity doped regions 105b may be disposed between the channel portions 123 and the device isolation pattern 101. Each of a first impurity doped regions 105a may be formed in a region surrounded by the ring-shaped structure of the channel portions 123 in a plan view.

A first interlayer dielectric layer 130, a second interlayer dielectric layer 150 and a third interlayer dielectric layer may be sequentially deposited on the substrate 100. Bit line contact plugs 135 may be disposed on the first impurity doped regions 105a, respectively. The bit line contact plugs 135, surrounded by each of the ring-shaped structure of the channel portions 123, may avoid contacting the device isolation pattern 101. This structural separation may prevent a punch-through phenomenon along the interface of the device isolation pattern 101 because electrons of the first impurity doped regions 105a are not be trapped in the interface.

First bit lines 140a-U, 140a-L and second bit lines 140b-U, 140b-L may be formed on the first interlayer dielectric layer 130, running in parallel along the first direction. Each of the first bit lines 140a-U and 140a-L may be electrically connected to each of the bit line contact plugs 135 disposed on the first active portions 103a-1 and 103-4. For example, one of the first bit line 140a-U may be electrically connected to one of the first active portions 103a-1. The other first bit line 140a-L may be electrically connected to another first active portions 103a-4.

Each of the second bit lines 140b-U and 140b-L may be electrically connected to each of the bit line contact plugs 135 disposed on the second active portions 103b-2 and 103b-3. For example, one of the second bit line 140b-U may be electrically connected to one of the first impurity doped regions 105a in one of the second active portions 103b-2, using the bit line contact plug 135 through a first assistant contact plug 151, a second assistant contact plug 153, and an assistant pad 155. Another second bit line 140b-L may be electrically connected to one of the first impurity doped regions 105a in the second active portions 103b-3, using the bit line contact plug 135 through a first assistant contact plug 151, a second assistant contact plug 153, and an assistant pad 155.

Referring to FIG. 8D, an interconnection connecting between one of the first impurity doped regions 105a and one of the second bit line 140b-L is shown. The first assistant contact plug 151 may penetrate the second interlayer dielectric layer 150 to connect to the second bit line 140b-L. The second assistant contact plug 153 may penetrate the second interlayer dielectric layer 150 to connect to the bit line contact plug 135 that contacts one of the first impurity doped regions 105a. The assistant pad 155 may connect the first assistant contact plug 151 to the second assistant contact plug 153, resulting in connection between the one of the first impurity doped regions 105a and the second bit line 140b-L.

Conductive pads 163 may be disposed on the first source contact plugs 157, respectively. Referring to FIG. 8E, via contact plugs 167 may electrically connect to each of the conductive pads 163, respectively.

Referring to FIG. 8B, second source contact plugs 165 may be disposed on the second impurity doped regions 105b, respectively. Unlike the previous embodiments of FIG. 1B where second source contact plugs 165 may be disposed in either side of the channel portions 123, the second source contact plugs 165 of FIG. 8B may be disposed at one side of each of the channel portions 123. Specifically, each of the second source contact plugs 165 may be disposed on the active portions 103a-1, 103-4, 103b-2 and 103b-3, respectively. The second source contact plugs 165 may include at least one of a doped semiconductor material (e.g. doped poly silicon, etc), a metal-semiconductor compound (e.g. a metal silicide, etc), a conductive metal nitride (e.g. titanium nitride, tantalum nitride, or tungsten nitride, etc), and metal (e.g. titanium, tungsten, or tantalum, etc). Metal wires 170 may be disposed on the third interlayer dielectric layer 160.

The semiconductor device according to the present embodiments may have the same effects as those of the semiconductor device according to the above embodiments described with reference to FIGS. 1A to 1E.

A method of forming a semiconductor device of FIG. 8A according to other embodiments of the inventive concept will be described below. FIGS. 9A and 10A are plan views illustrating a method of forming a semiconductor device according to other embodiments of the inventive concept. FIG. 9B is a cross sectional view taken along a line I-I' of FIG. 9A, and FIG. 9C is a cross sectional view taken along a line II-IF of FIG. 9A. FIG. 10B is a cross sectional view taken along a line I-I' of FIG. 10A, FIG. 10C is a cross sectional view taken along a line IV-IV' of FIG. 10A, and FIG. 10D is a cross sectional view taken along a line V-V' of FIG. 10A.

Referring to FIGS. 9A, 9B, and 9C, a device isolation pattern 101 may be formed in a substrate 100 to define a pair of first active portions 103a-1 and 103a-4 and a pair of second active portions 103b-2 and 103b-3.

A pair of gate electrodes 120a may be formed on the substrate 100, and gate dielectric patterns 110 may be formed between the gate electrodes 120a and the active portions 103a-1, 103a-4, 103b-2 and 130b-3. The pair of gate electrodes 120a may run across the first and second active portions 103a-1, 103a-4, 103b-2 and 103b-4 and the device isolation 101 along the first direction. A gate dielectric layer may be formed on the substrate 100 and then the gate dielectric layer may be patterned to form the gate dielectric patterns 110. The gate dielectric layer may be formed by a chemical vapor deposition (CVD) process, an atomic layer deposition (ALD) process, and a thermal oxidation process.

A gate conductive layer may be formed on the substrate 100 and then the gate conductive layer may be patterned to form the gate electrodes 120a. The gate conductive layer may be single-layered or multi-layered. For example, the gate conductive layer may include at least one of a metal-semiconductor compound layer or a metal layer. The gate conductive layer may be formed by a chemical vapor deposition (CVD) process, an atomic layer deposition (ALD) process, and a physical vapor deposition (PVD) process.

In an embodiment, the patterning of the gate dielectric layer and the patterning of the gate conductive layer may be performed in a single process chamber. That is, the gate dielectric layer and the gate conductive layer may be sequentially formed, a mask pattern may be formed on the conductive layer, and the gate conductive layer and the gate dielectric layer may be etched using the same mask pattern as an etching mask in the single process chamber. Thus, the gate dielectric patterns 110 and the gate electrodes 120a may be formed. However, methods of forming the gate dielectric patterns 110 and the gate electrodes 120a are not limited to the method described above. The gate dielectric patterns 110 and the gate electrode 120a may be formed, by various methods.

Each of the gate electrodes 120a may include a plurality of channel portions 123, a plurality of first connecting portions 125a and a plurality of second connecting portion 125b. The channel portions 123 may have the ring-shape structure of FIGS. 1A to 1E. The first connecting portions 125a and the second connecting portions 125b may be alternately arranged along the first direction.

The channel portion 123 may be disposed between the first connecting portion 125a and the second connecting portions alternately arranged in the first direction. The first connecting portion 125a may connect neighboring channel portions 123 disposed on one of the first active portions 103a-4 and one of the second active portions 103b-3, respectively. The second connecting portion 125b may connect neighboring channel portions 123 disposed on the second active portions 103b-2 and 103b-3. The first and second connecting portions 125a and 125b may have various ways of connecting two neighboring channel portions 123 according to a position where the connecting portions 125a and 125b connects two neighboring channel portions 123. For example, each of the first connecting portions 125a connects two neighboring channel portions 123 along imaginary lines running through centers of two neighboring channel portions 123. Alternatively, each of the first connecting portions 125a connects two neighboring channel portions 123 along imaginary lines running through sides of two neighboring channel portions 123.

First impurity doped regions 105a and second impurity doped regions 105b may be formed in the first active portions 103a-1 and 103-4 and the second active portions 103b-2 and 103h-3 by injecting impurities into the active portions 103a-1, 103b-2, 103b-3 and 103a-4 of the substrate 100 having the gate electrodes 120a.

Figure 7A:
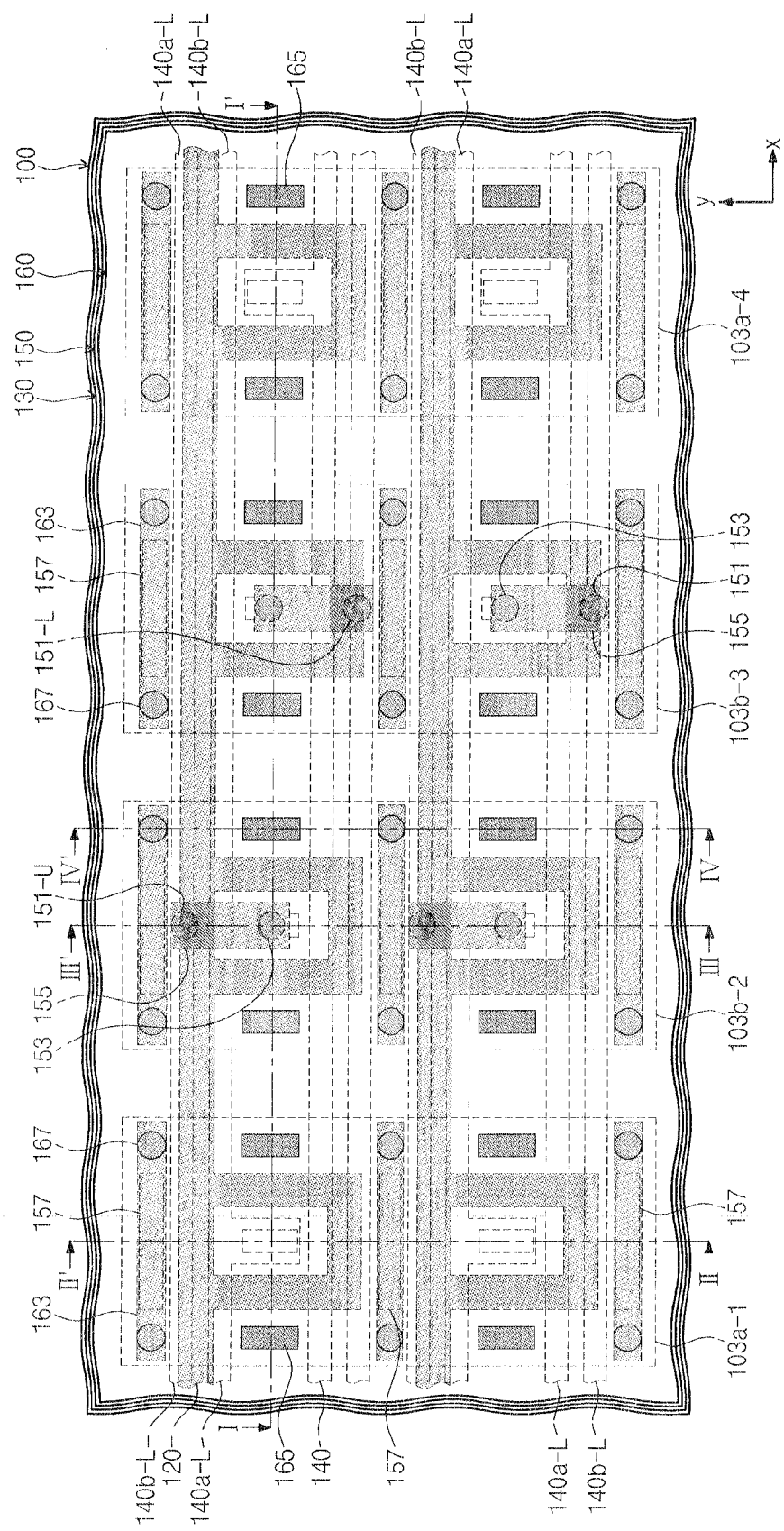
Figure 7B:
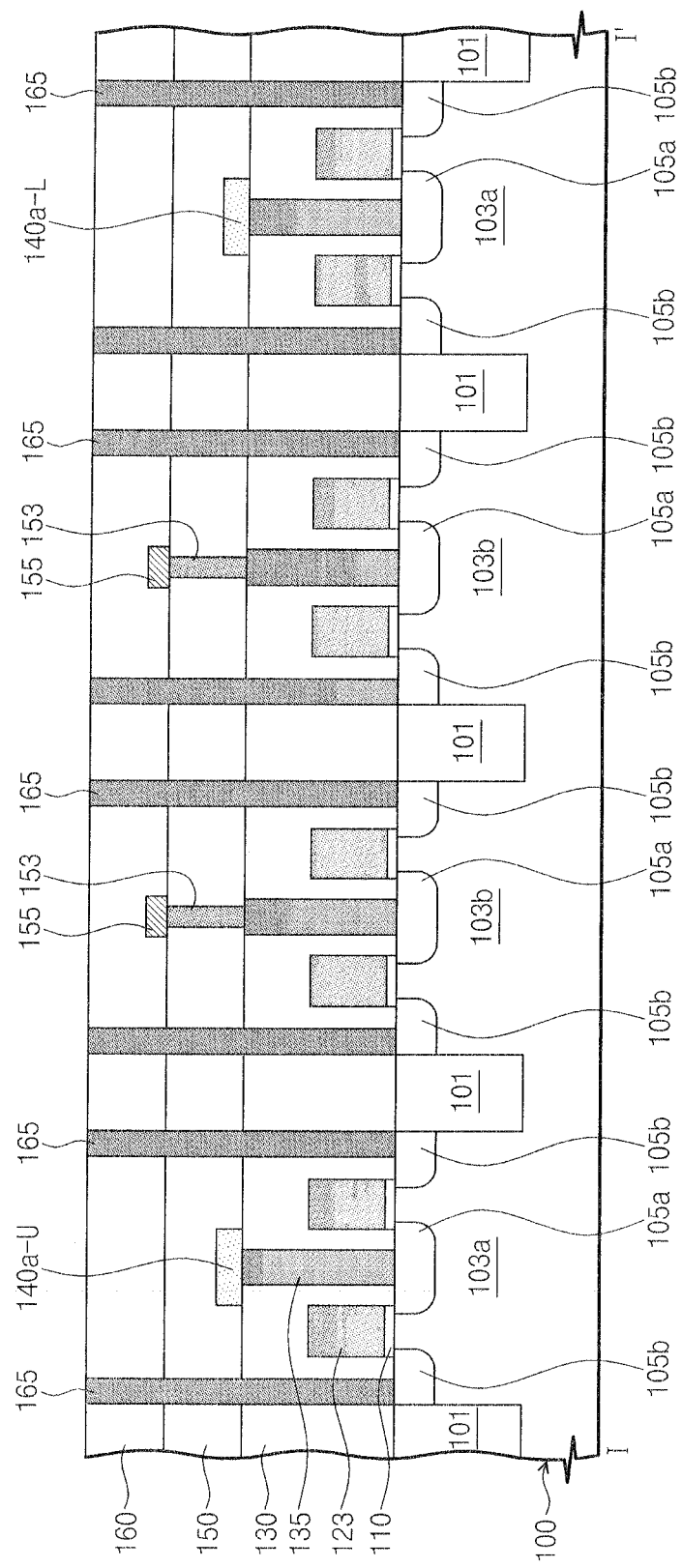
Figure 7C:
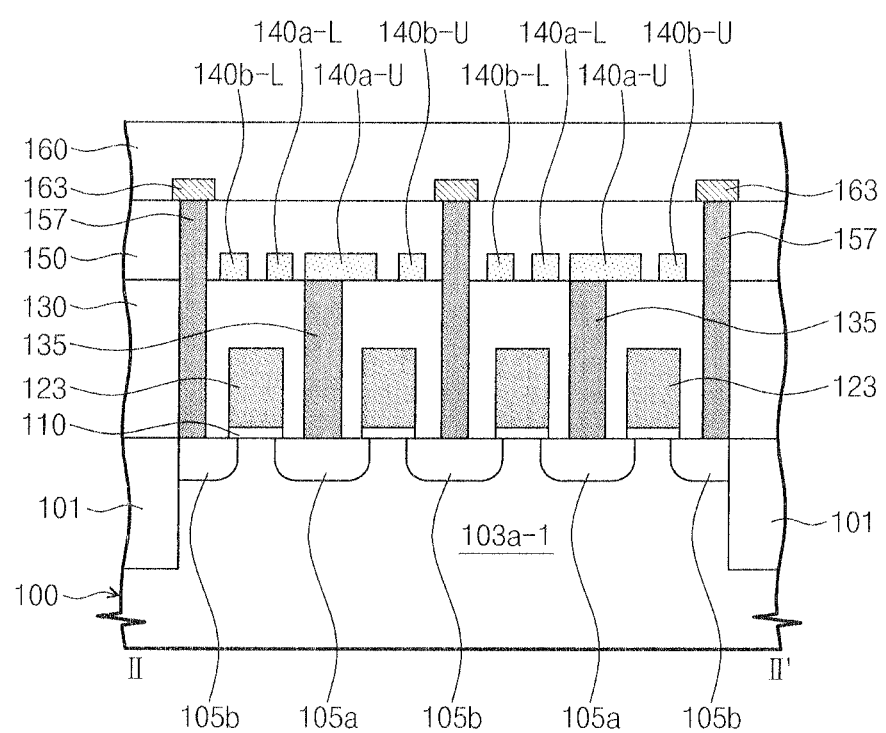
Figure 7D:
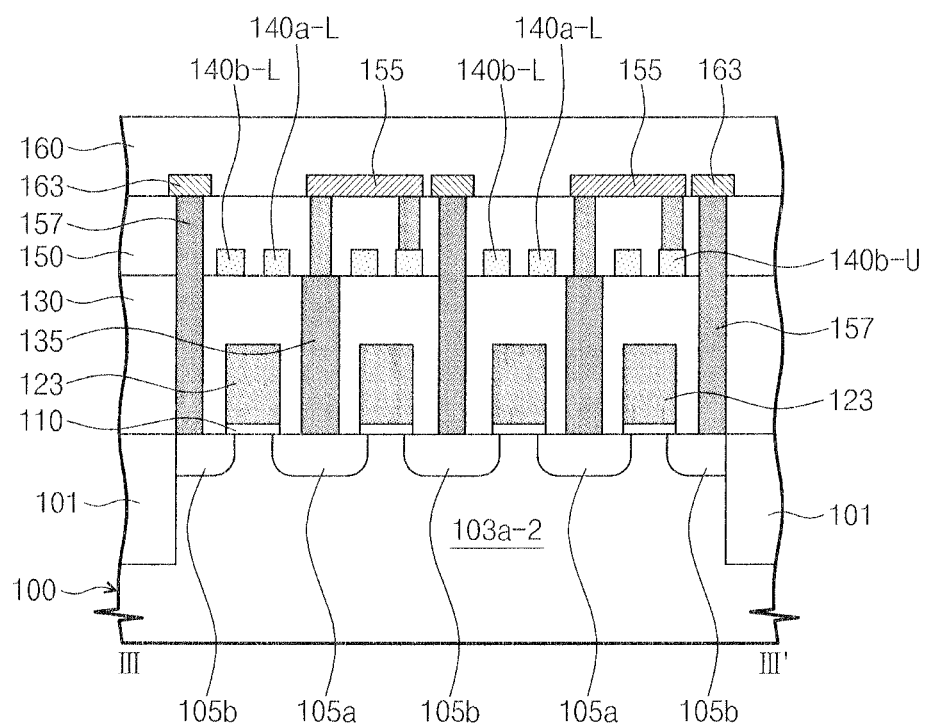
Figure 7E:
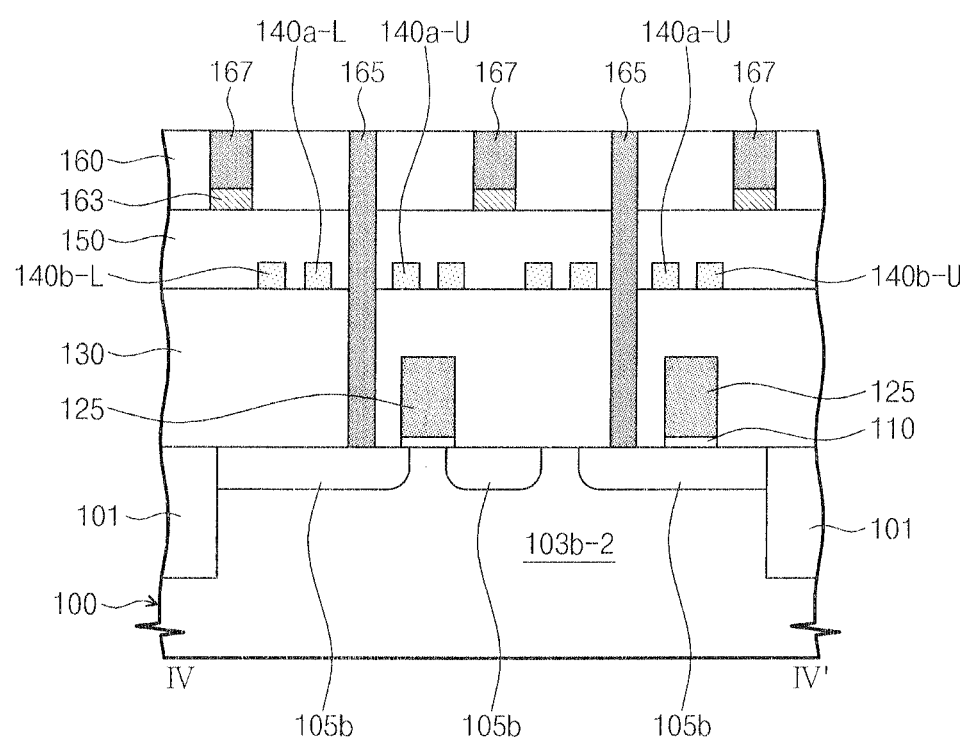
FIG. 7E is a cross sectional view taken along a line IV-IV' of FIG. 7A.

A cross sectional view taken along a line II-II' of FIG. 10A may be the same as FIG. 7C, and a cross sectional view taken along a line III-III' of FIG. 10A may be the same as FIG. 7D. Referring to FIGS. 10A, 10B, 10C, 10D, 7C and 7D, interlayer dielectric layers 130, 150 and 160 may be formed on the substrate 100. Bit line contact plugs 135, first bit lines 140a, second bit lines 140b, first assistant contact plugs 151, second assistant contact plugs 153, assistant pads 155, first source contact plugs 157, and conductive pads 163 may be formed by the same methods described in the above embodiments.

Second source contact plugs 165 may be formed on second impurity regions 105b disposed between the device isolation pattern 101 and the channel portions 123. A pair of the second source contact plugs 165 may be disposed on each of the active portions 103a-1, 103b-2, 103h-3 and 103b-4. The second source contact plugs 165 may include at least one of a doped semiconductor material (e.g. doped poly silicon, etc), a metal-semiconductor compound (e.g. a metal silicide, etc), a conductive metal nitride (e.g. titanium nitride, tantalum nitride, or tungsten nitride, etc), and metal (e.g. titanium, tungsten, or tantalum, etc). Metal wires 170 may be formed on the third interlayer dielectric layer 160.

The active portions 103a-1, 103b-2, 103b-3 and 103a-4, first impurity doped regions 105a, second impurity doped regions 105b, gate dielectric patterns 110, and gate electrodes 120 and 120, which are described with reference to FIGS. 1A to 1E and FIGS. 8A to 8E, may constitute driving transistors according to the inventive concept. Referring to FIG. 11, a semiconductor device 200 according to embodiments of the inventive concept may include a cell region 210 and a driving circuit region 220. The cell region 210 may include memory cells. Each of the memory cells may include a selection element and a data storage element. Thus, the cell region 210 may perform a function to store or erase data by an electrical signal. The driving circuit region 220 may include driving transistors for operation of the selection elements in the cell region 210. The driving transistor in the driving circuit region 220 may include the active portion 103a-1, 103b-2, 103b-3 and 103a-4, the first impurity doped region 105a, the second impurity doped region 105b, the gate dielectric pattern 110 and the gate electrode 120 or 120a which are described in the above embodiments.

FIG. 12 is a schematic block diagram illustrating an exemplary electronic system including semiconductor devices according to embodiments of the inventive concept.

Referring to FIG. 12, an electronic system 1100 according to an embodiment of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one of the semiconductor devices according to the embodiments described above. The memory device 1130 may further include another type of semiconductor memory devices which are different from the semiconductor devices described above. For example, the memory device 1130 may further include a non-volatile memory device (e.g. a magnetic memory device, a phase change memory device, etc), a dynamic random access memory (DRAM) device and/or a static random access memory (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast SRAM device for a cache memory.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

FIG. 13 is a schematic block diagram illustrating an exemplary memory card including semiconductor devices according to embodiments of the inventive concept.

Referring to FIG. 13, a memory card 1200 according to an embodiment of the inventive concept may include a memory device 1210. The memory device 1210 may include at least one of the semiconductor devices according to the embodiments mentioned above. In other embodiments, the memory device 1210 may further include another type of semiconductor memory devices which are different from the semiconductor devices according to the embodiments described above. For example, the memory device 1210 may further include a non-volatile memory device (e.g. a magnetic memory device, a phase change memory device, etc), a dynamic random access memory (DRAM) device and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

The semiconductor devices described above may be encapsulated using various packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
a cell region including memory cells, each of memory cells including a selection element and a data storage element; and
a driving circuit region including a driving transistor configured to operate the selection element, wherein the driving transistor comprises:
active portions defined by a device isolation pattern in a substrate;
a gate electrode running across the active portions along a first direction, the gate electrode including channel portions of a ring-shaped structure;
first impurity doped regions disposed in the active portions, each of the first impurity doped regions being surrounded by each of channel portions;
second impurity doped regions disposed in the active portions, the second impurity doped regions being separated from the first impurity doped regions by the channel portions; and
bit line contact plugs disposed on the first impurity doped regions,
wherein the gate electrode further includes connecting portions being arranged in a row along the first direction, each of the connecting portions connecting two neighboring channel portions.

2. The semiconductor device of claim 1 further comprising a first bit line running along the first direction and having a pad protruding to a second direction, wherein the pad is connected to one of the bit line contact plugs and the second direction is perpendicular to the first direction.

3. The semiconductor device of claim 2 further comprising a second bit line running along the first direction and being connected to another of the bit line contact plugs through an assistant pad, wherein the assistant pad is formed over the first bit line and runs along the second direction.

4. The semiconductor device of claim 3 further comprising a first assistant contact plug and a second assistant contact plug, wherein the first assistant contact plug connects the second bit line and the assistant pad, and the second assistant contact plug connects the another of the bit line contact plugs and the assistant pad.

5. The semiconductor device of claim 1, further comprising first source contact plugs and second source contact plugs formed on the second impurity doped regions and disposed between the device isolation pattern and the channel portions,
wherein the first source contact plugs are disposed on either side of the channel portions along the second direction and the second source contact plugs are disposed on either side of the channel portions along the first direction.

6. The semiconductor device of claim 5 further comprising metal wires running in parallel along the second direction, wherein the metal wires directly contact the second source contact plugs and the metal wires directly contact the first source contact plugs formed on conductive pads.

7. The semiconductor device of claim 6 wherein a pair of the metal wires is disposed over each of the active portions.

8. The semiconductor device of claim 1, wherein the each of the connecting portions runs along an imaginary line running through centers of the two neighboring channel portions.

9. The semiconductor device of claim 8, wherein first source contact plugs and second source contact plugs are formed on the second impurity doped regions and are disposed between the device isolation pattern and the channel portions, wherein the first source contact plugs are disposed on either side of the channel portions along the second direction and the second source contact plugs are disposed on one side of the channel portions along the first direction.

10. A semiconductor device comprising:
a device isolation pattern;
a first active portion surrounded by the device isolation pattern;
a second active portion surrounded by the device isolation pattern and disposed next to the first active portion along a first direction;
a gate electrode running across the first and second active portions along the first direction, the gate electrode comprising a first channel portion and a second channel portion, wherein the first channel portion is disposed on the first active portion and has a first ring-shaped structure and the second channel portion is disposed on the second active portion and has a second ring-shaped structure;
a first bit line running across the first and second active portions along the first direction and having a pad protruding to the second direction, the pad being electrically connected to a first impurity doped region surrounded by the first ring-shaped structure;
a second bit line running across the first and second active portions along the first direction and electrically connected to a first impurity doped region surrounded by the second ring-shaped structure; and a connecting portion connecting the first ring-shaped structure and the second ring-shaped structure and running along the first direction.

11. The semiconductor device of claim 10, wherein the connecting portion runs along an imaginary line running through a center of the first ring-shaped structure and a center of the second ring-shaped structure.

12. The semiconductor device of claim 10, wherein the first active portion includes a second impurity region separated by the first ring-shaped structure from the first impurity region surrounded by the first ring-shaped structure, and the second active portion includes a second impurity region separated by the second ring-shaped structure from the first impurity region surrounded by the second ring-shaped structure.

13. The semiconductor device of claim 12, wherein the first impurity doped region is spaced apart from the device isolation pattern.

14. The semiconductor device of claim 12, wherein the pad of the first bit line is connected to a bit line contact formed on the first impurity doped region surrounded by the first ring-shaped structure, and the second bit line is connected to the first impurity doped region surrounded by the second ring-shaped structure through a two-level interconnection.

15. The semiconductor device of claim 14, wherein the two-level interconnection includes a conductive pad and a second interlayer dielectric layer, wherein the conductive pad is disposed on the second interlayer dielectric layer and the second bit line is disposed in the dielectric layer below the conductive pad.

16. The semiconductor device of claim 15, wherein the two-level interconnection further includes a first assistant contact plug and a second assistant contact plug, the first assistant contact plug connecting the second bit line and the conductive pad, and the second assistant contact plug connecting the conductive pad and the first impurity doped region surrounded by the second ring-shaped structure by the second assistant contact plug.

17. The semiconductor device of claim 16, wherein the first active portion further comprises first source contact plugs and second source contact plugs disposed between the device isolation pattern and the first ring-shaped structure, the first source contact plugs being disposed on either side of the channel portion along the second direction and the second source contact plugs being disposed on either sides of the channel portion along the first direction.

* * * * *